US012755929B2

(12) United States Patent
Wieland

(10) Patent No.: US 12,755,929 B2
(45) Date of Patent: Oct. 6, 2026

(54) ASSESSMENT SYSTEM, METHOD OF ASSESSING

(71) Applicant: ASML Netherlands B.V., Veldhoven (NL)

(72) Inventor: Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 368 days.

(21) Appl. No.: 18/506,923

(22) Filed: Nov. 10, 2023

(65) Prior Publication Data

US 2024/0079205 A1 Mar. 7, 2024

Related U.S. Application Data

(63) Continuation of application No. PCT/EP2022/061407, filed on Apr. 28, 2022.

(30) Foreign Application Priority Data

May 12, 2021 (EP) .................................... 21173657
May 20, 2021 (EP) .................................... 21175090

(51) Int. Cl.
*H01J 37/26* (2006.01)
*H01J 37/12* (2006.01)
*H01J 37/28* (2006.01)

(52) U.S. Cl.
CPC ............ *H01J 37/265* (2013.01); *H01J 37/12* (2013.01); *H01J 37/28* (2013.01); (Continued)

(58) Field of Classification Search
CPC .......... H01J 37/265; H01J 37/12; H01J 37/28; H01J 2237/1205; H01J 2237/1207; H01J 2237/2817
See application file for complete search history.

(56) References Cited

U.S. PATENT DOCUMENTS 9,922,796 B1 3/2018 Frosten et al.
2003/0001095 A1 1/2003 Lo et al.
(Continued)

FOREIGN PATENT DOCUMENTS

EP 2425444 A1 3/2012
EP 1602121 A2 3/2014
(Continued)

OTHER PUBLICATIONS

PCT International Search Report, corresponding with a PCT Application No. PCT/EP2022/061407, mailed on Aug. 17, 2022. (2 pages).

*Primary Examiner* — Nicole M Ippolito
(74) *Attorney, Agent, or Firm* — Finnegan, Henderson, Farabow, Garrett & Dunner LLP

(57) ABSTRACT

Assessment systems and methods are disclosed. In one arrangement, charged particles are directed in sub-beams arranged in a multi-beam towards a sample. A plurality of control electrodes define a control lens array. Each control lens in the control lens array is aligned with a sub-beam path of a respective sub-beam of the multi-beam and configured to operate on the respective sub-beam. A plurality of objective electrodes define an objective lens array that directs the sub-beams onto a sample. Objective lenses are aligned with a sub-beam path aligned with a respective control lens. Selectable landing energies are implemented for a sub-beam of the multi-beam by applying corresponding potentials to the control electrodes and the objective electrodes. A controller is configured to select corresponding potentials so a spatial relationship between an image plane of the system and all control electrodes and objective electrodes is the same for each selectable landing energy.

20 Claims, 11 Drawing Sheets

(52) U.S. Cl.
CPC .................. *H01J 2237/1205* (2013.01); *H01J 2237/1207* (2013.01); *H01J 2237/2817* (2013.01)

(56) References Cited

U.S. PATENT DOCUMENTS

| | | | | |
|---|---|---|---|---|
| 2006/0289804 | A1 | 12/2006 | Knippelmeyer et al. | |
| 2012/0091318 | A1 | 4/2012 | Wieland et al. | |
| 2013/0341526 | A1 | 12/2013 | Ohashi | |
| 2017/0213688 | A1 * | 7/2017 | Ren | H01J 37/06 |
| 2018/0040452 | A1 * | 2/2018 | Hatakeyama | H01J 37/26 |
| 2019/0353975 | A1 * | 11/2019 | Didomenico | G02B 3/14 |
| 2020/0381207 | A1 | 12/2020 | Ren et al. | |
| 2020/0381212 | A1 | 12/2020 | Ren et al. | |

FOREIGN PATENT DOCUMENTS

| | | | | |
|---|---|---|---|---|
| EP | 2702595 | A1 | 3/2014 | |
| EP | 2715768 | A2 | 4/2014 | |
| TW | 201937526 | A | 9/2019 | |
| WO | WO-2021078352 | A1 * | 4/2021 | H01J 37/28 |

* cited by examiner

ASSESSMENT SYSTEM, METHOD OF ASSESSING

CROSS-REFERENCE TO RELATED APPLICATIONS

This application claims priority of International application PCT/EP2022/061407, filed on 28 Apr. 2022, which claims priority of EP application 21173657.4, filed on 12 May 2021, and of EP application 21175090.6, filed on 20 May 2021. These applications are incorporated herein by reference in their entireties.

FIELD

The embodiments provided herein relate to assessment systems and methods that use charged particles, particularly electrons, to assess a sample, for example by detecting signal electrons emitted from the sample.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, which may be referred to as samples, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause signal electrons to be emitted from the surface, such as secondary electrons, backscattered electrons or Auger electrons. The signal electrons may be emitted from the material structure of the sample. By scanning the primary electron beam as the probing spot over the sample surface, signal electrons can be emitted across the surface of the sample. By collecting these emitted signal electrons from the sample surface, a pattern inspection tool may obtain an image representing characteristics of the material structure of the surface of the sample.

There is a general need to improve control of charged particle beams in assessment systems and methods.

SUMMARY

It is an object of the present disclosure to improve control of charged particle beams in assessment systems and methods.

According to some embodiments of the present disclosure, there is provided an assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller configured to implement a plurality of selectable landing energies for a sub-beam of the multi-beam by applying corresponding potentials to the control electrodes and the objective electrodes, wherein: the controller is configured to select the corresponding potentials such that a spatial relationship between an image plane of the system and all of the control electrodes and objective electrodes is the same for each of the selectable landing energies.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
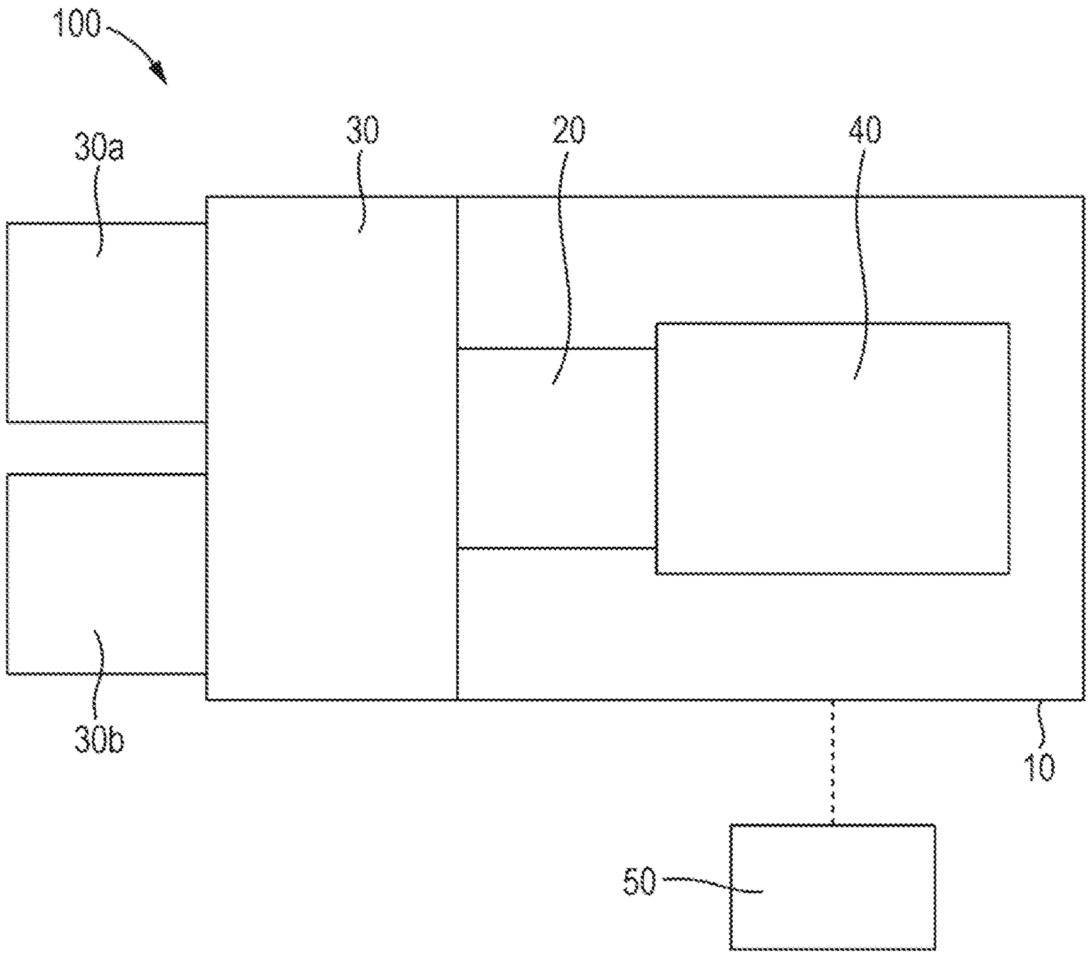
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000$^{th}$ of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100, which may also be referred to as a charged particle beam assessment system or simply assessment system. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
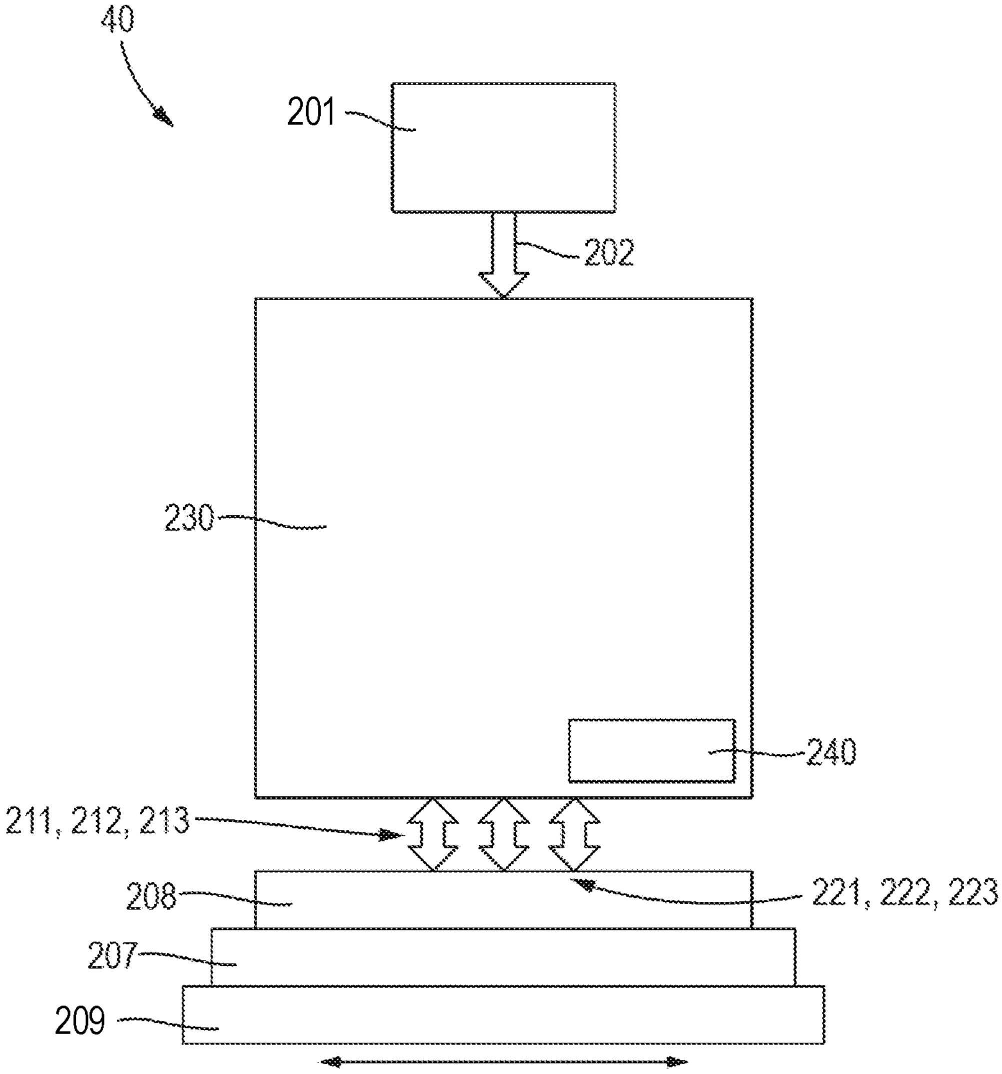
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a projection apparatus 230, a motorized stage 209, and a sample holder 207. The electron source 201 and projection apparatus 230 may together be referred to as an illumination apparatus. The sample holder 207 is supported by motorized stage 209 so as to hold a sample 208 (e.g., a substrate or a mask) for inspection. Multi-beam electron beam tool 40 further comprises an electron detection device 240.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of sub-beams 211, 212, 213 and to direct each sub-beam onto the sample 208. Although three sub-beams are illustrated for simplicity, there may be many tens, many hundreds, many thousands, many tens of thousands, or even hundreds of thousands (or more) of sub-beams. The sub-beams may be referred to as beamlets.

Controller 50 may be connected to various parts of charged particle beam inspection apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus sub-beams 211, 212, and 213 onto a sample 208 for inspection and may form three probe spots 221, 222, and 223 on the surface of sample 208. Projection apparatus 230 may be configured to deflect primary sub-beams 211, 212, and 213 to scan probe spots 221, 222, and 223 across individual scanning areas in a section of the surface of sample 208. In response to incidence of primary sub-beams 211, 212, and 213 on probe spots 221, 222, and 223 on sample 208, electrons are generated from the sample 208 which include secondary electrons and backscattered electrons which may be referred to as signal particles. The secondary electrons typically have electron energy ≤50 eV and backscattered electrons typically have electron energy between 50 eV and the landing energy of primary sub-beams 211, 212, and 213.

Electron detection device 240 is configured to detect secondary electrons and/or backscattered electrons and to generate corresponding signals which are sent to controller 50 or a signal processing system (not shown), e.g. to construct images of the corresponding scanned areas of sample 208. Electron detection device may be incorporated into the projection apparatus or may be separate therefrom, with a secondary optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps and/or scans of the scanning process for example as disclosed in EPA 21171877.0 filed 3 May 2021 which is hereby incorporated in so far as the combined stepping and scanning strategy at least of the stage.

Figure 3:
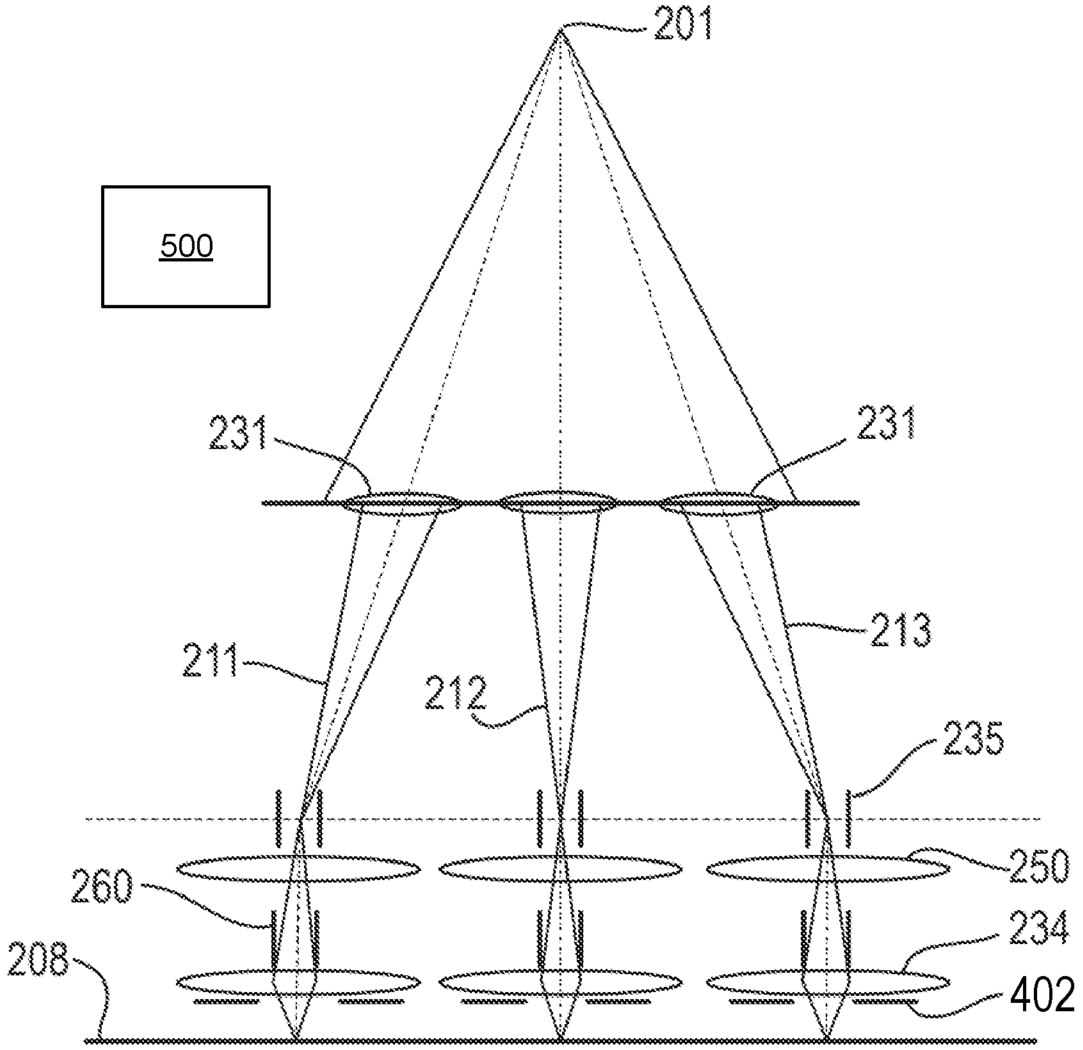
FIG. 3 is a schematic diagram of an exemplary electron-optical column comprising a condenser lens array.

FIG. 3 is a schematic diagram of an exemplary electron-optical column for use in an assessment system. For ease of illustration, lens arrays are depicted schematically herein by arrays of oval shapes. Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. As described below, lens arrays may instead comprise multiple plates with apertures. Each plate with apertures may be referred to as an electrode. The electrodes may be provided in series along sub-beam paths of sub-beams of a multi-beam.

Electron source 201 directs electrons toward an array of condenser lenses 231 forming part of projection system 230. The electron source is desirably a high brightness thermal field emitter with a good compromise between brightness and total emission current. There may be many tens, many hundreds or many thousands of condenser lenses 231. Condenser lenses of array 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The condenser lens array may take the form of at least two, preferably three, plates, acting as electrodes, with an aperture in each plate aligned with each other and corresponding to the location of a sub-beam. At least two of the plates are maintained during operation at different potentials to achieve the desired lensing effect. Between the plates of the condenser lens array are electrically insulating plates for example made of an insulating material such as ceramic or glass, with one or more apertures for the sub-beams. An alternative arrangement one more of the plates may feature apertures each with their own electrode, each with an array of electrodes around their perimeter or arranged in groups of apertures having a common electrode.

In an arrangement the condenser lens array is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

Each condenser lens in the array directs electrons into a respective sub-beam 211, 212, 213 which is focused at a respective intermediate focus 233. A collimator or an array of collimators may be positioned to operate on the respective intermediate focus 233. The collimators may take the form of deflectors 235 provided at the intermediate focuses 233. Deflectors 235 are configured to bend a respective beamlet 211, 212, 213 by an amount effective to ensure that the principal ray (which may also be referred to as the beam axis) is incident on the sample 208 substantially normally (i.e. at substantially 90° to the nominal surface of the sample).

Below (i.e. downbeam or further from source 201) deflectors 235 there is a control lens array 250 comprising a control lens 251 for each sub-beam 211, 212, 213. Control lens array 250 may comprise two or more, preferably at least three, plate electrode arrays connected to respective potential sources, preferably with insulating plates in contact with the electrodes for example between the electrodes. Each of the plate electrode arrays may be referred to as a control electrode. A function of control lens array 250 is to optimize the beam opening angle with respect to the demagnification of the beam and/or to control the beam energy delivered to the objective lenses 234, each of which directs a respective sub-beam 211, 212, 213 onto the sample 208.

Optionally an array of scan deflectors 260 is provided between the control lens array 250 and the array of objective lenses 234 (objective lens array). The array of scan deflectors 260 comprises a scan deflector 261 for each sub-beam 211, 212, 213. Each scan deflector is configured to deflect a respective sub-beam 211, 212, 213 in one or two directions so as to scan the sub beam across the sample 208 in one or two directions.

A detector module 402 of a detector is provided within or between the objective lenses 234 and the sample 208 to detect signal electrons/particles emitted from the sample 208. An exemplary construction of such a detector module 402 is described below. Note that the detector additionally or alternative may have detector elements up-beam along the primary beam path of the objective lens array or even the control lens array.

Figure 4:
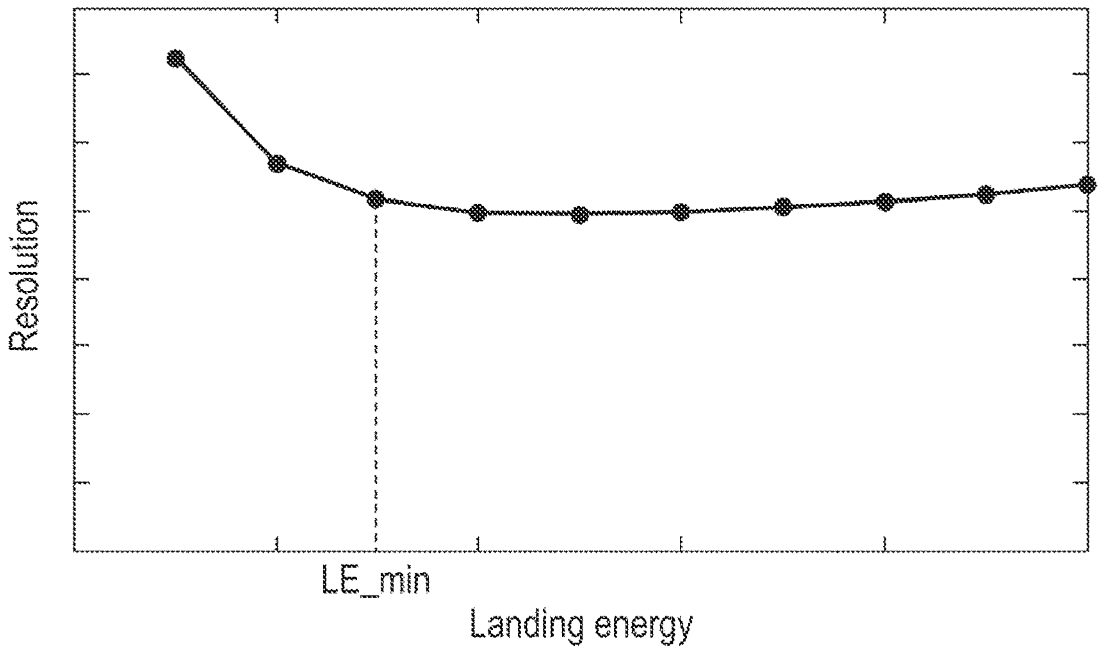
FIG. 4 is a graph of landing energy vs. resolution of an exemplary arrangement.

The system of FIG. 3 is configured to control the landing energy of the electrons on the sample by varying the potentials applied to the electrodes of the control lenses and the objective lenses. The control lenses and objective lenses work together and may be referred to as an objective lens assembly. The landing energy can be selected to increase emission and detection of secondary electrons dependent on the nature of the sample being assessed. A controller may be configured to control the landing energy to any desired value within a predetermined range or to a desired one of a plurality of predetermined values. In some embodiments, the landing energy can be controlled to a desired value in a predetermined range, e.g. from 1000 eV to 5000 eV. FIG. 4 is a graph depicting resolution as a function of landing energy, assuming the beam opening angle/demagnification is re-optimized for changing landing energy. As can be seen, the resolution of the assessment tool can be kept substantially constant with change in landing energy down to a minimum value LE_min. Resolution deteriorates below LE_min because it is necessary to reduce the lens strength of, and electric fields within, the objective lens in order to maintain a minimum spacing between objective lens and/or detector and the sample. Exchangeable modules, as discussed further below, may also be employed to vary or control the landing energy.

It should be noted here that the 'resolution' as depicted along the horizontal or x axis of the graph of FIG. 4 is the smallest resolvable dimension (e.g. size) of a sub-beam at the sample. Resolution (e.g. along the x axis) has units of distance, for example values in units of nanometers. Typically the beam shape is close to a gaussian. An often used definition of the size or the resolution of such a beam with a gaussian profile is the beam diameter of that contains fifty percent (50%) of the current (which may be referred to as a two-dimensional FW50). Another definition often used is the distance between the first and third quartile of the intensity level or twenty five percent (25%) and the seventy-five percent (75%) intensity level when the beam is scanned over an edge (which may be referred to as a one-dimensional FW50). These definitions are expressed in units of distance. Assuming a gaussian beam shape, they can be translated into each other by multiplying with a scaling factor. It should be noted that these measurements are made on the primary beam, before signal particles are generated, let alone detected. Therefore reference to resolution as disclosed herein is unrelated to image resolution and thus pixel size. For the avoidance of doubt, in a set of terminology used herein the resolution defines a resolution of a beam; the smallest resolvable dimension of the beam at the surface of the sample.

Desirably, the landing energy is primarily varied by controlling the energy of the electrons exiting the control lens. The potential differences within the objective lenses are preferably kept constant during this variation so that the electric field within the objective lens remains as high as possible. The potentials applied to the control lens in addition may be used to optimize the beam opening angle and demagnification. The control lens can also be referred to as a refocus lens as it can function to correct the focus position in view of changes in the landing energy. Desirably, each control lens comprises three electrodes so as to provide two independent control variables as further discussed below. For example, one of the electrodes can be used to control demagnification while a different electrode can be used to independently control landing energy. Alternatively each control lens may have only two electrodes. When there are only two electrodes, in contrast, one of the electrodes may need to control both demagnification and landing energy.

Figure 5:
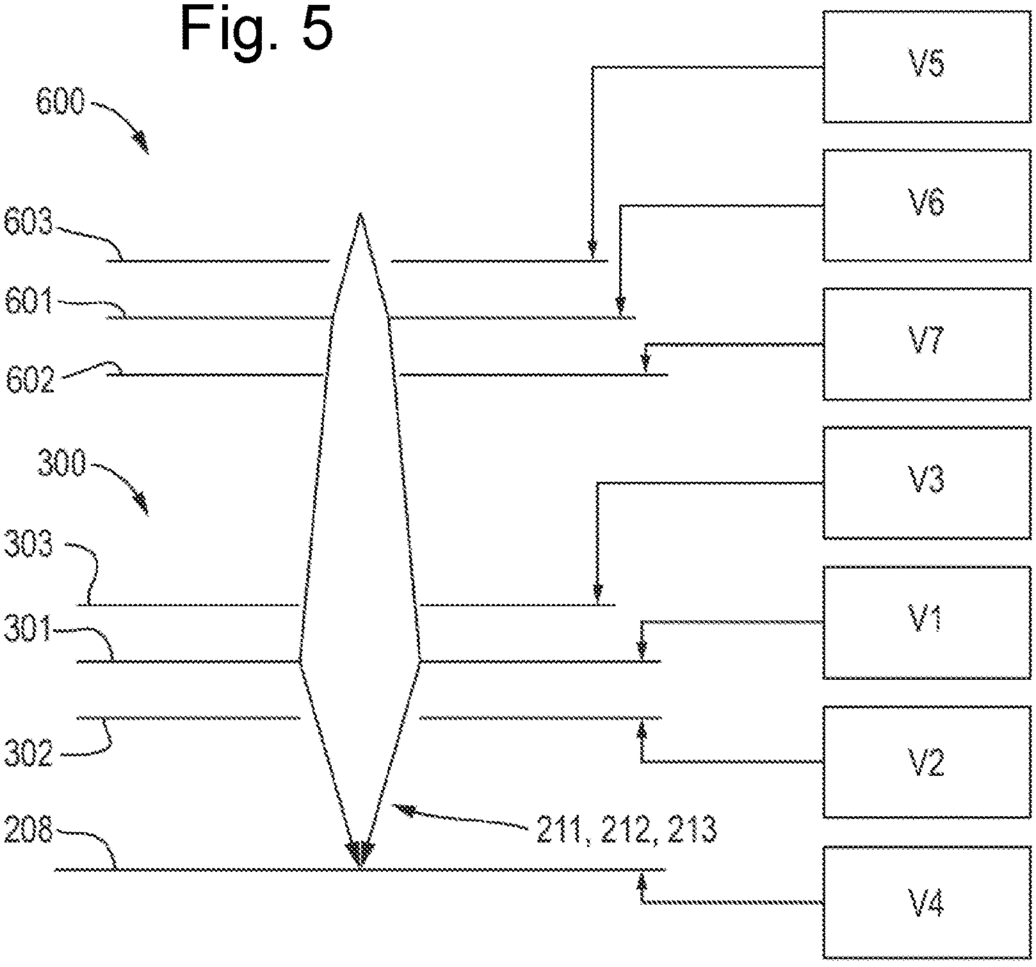
FIG. 5 is an enlarged diagram of an objective lens and a control lens.

FIG. 5 is an enlarged schematic view of one objective lens 300 of the objective lens array and one control lens 600 of the control lens array 250. Objective lens 300 can be configured to demagnify the electron beam by a factor greater than 10, desirably in the range of 50 to 100 or more. The objective lens comprises a middle or first electrode 301, a lower or second electrode 302 and an upper or third electrode 303. Voltage sources V1, V2, V3 are configured to apply potentials to the first, second and third electrodes respectively. A further voltage source V4 is connected to the sample to apply a fourth potential, which may be ground. Potentials can be defined relative to the sample 208. The first, second and third electrodes are each provided with an aperture through which the respective sub-beam propagates. The second potential can be similar to the potential of the sample, e.g. in the range of from 50 V to 200 V more positive than the sample. Alternatively the second potential can be in the range of from about +500 V to about +1,500 V relative to the sample. A higher potential is useful if the detector module 402 is higher in the optical column than the lowest electrode. The first and/or second potentials can be varied per aperture or group of apertures to effect focus corrections.

Desirably, in some embodiments, the third electrode is omitted. An objective lens having only two electrodes can have lower aberration than an objective lens having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam.

As mentioned above, it is desirable to use the control lens to determine the landing energy. However, it is possible to use in addition the objective lens 300 to control the landing energy. In such a case, the potential difference over the objective lens is changed when a different landing energy is selected. One example of a situation where it is desirable to partly change the landing energy by changing the potential difference over the objective lens is to prevent the focus of the sub-beams getting too close to the objective lens. This situation can for example occur if the landing energy is lowered. This is because the focal length of the objective lens roughly scales with the landing energy chosen. By lowering the potential difference over the objective lens, and thereby lowering the electric field inside the objective lens, the focal length of the objective lens is made larger again, resulting in a focus position further below the objective lens.

In the arrangement depicted, control lens 600 comprises three electrodes 601-603 connected to potential sources V5 to V7. Electrodes 601-603 may be spaced a few millimeters (e.g. 3 mm) apart. The spacing between the control lens and the objective lens (i.e. the gap between lower electrode 602 and the upper electrode of the objective lens) can be selected from a wide range, e.g. from 2 mm to 200 mm or more. A small separation makes alignment easier whereas a larger separation allows a weaker lens to be used, reducing aberrations. Desirably, the potential V5 of the uppermost electrode 603 of the control lens 600 is maintained the same as the potential of the next electron-optic element up-beam of the control lens (e.g. deflectors 235). The potential V7 applied to the lower electrode 602 can be varied to determine the beam energy. The potential V6 applied to the middle electrode 601 can be varied to determine the lens strength of the control lens 600 and hence control the opening angle and demagnification of the beam. Desirably, the lower electrode 602 of the control lens and the uppermost electrode of the objective lens and the sample has substantially the same potential. In one design the upper electrode of the objective lens V3 is omitted. In this case desirably the lower electrode 602 of the control lens and electrode 301 of the objective lens have substantially the same potential. It should be noted that even if the landing energy does not need to be changed, or is changed by other means, the control lens can be used to control the beam opening angle. The position of the focus of a sub-beam is determined by the combination of the actions of the respective control lens and the respective objective lens.

In an example, to obtain landing energies in the range of 1.5 kV to 2.5 kV, potentials V1, V2, V4, V5, V6 and V7 can be set as indicated in Table 1 below. The potentials in this table are given as values of beam energy in keV, which is equivalent to the electrode potential relative to the cathode of the beam source 201. It will be understood that in designing an electron-optical system there is considerable design freedom as to which point in the system is set to a ground potential and the operation of the system is determined by potential differences rather than absolute potentials.

TABLE 1

| Landing Energy | 1.5 keV | 2.5 keV | 3.5 keV |
|---|---|---|---|
| V1 | 29 keV | 30 keV | 31 keV |
| V2 | 1.55 keV | 2.55 keV | 3.55 keV |
| V3 (or omitted) | 29 keV | 30 keV | 31 keV |
| V4 | 1.5 keV | 2.5 keV | 3.5 keV |
| V5 | 30 keV | 30 keV | 30 keV |
| V6 | 19.3 keV | 20.1 keV | 20.9 keV |
| V7 | 29 keV | 30 keV | 31 keV |

It will be seen that the beam energy at V1, V3 and V7 is the same. In embodiments the beam energy at these points may be between 10 keV and 50 keV. If a lower potential is selected, the electrode spacings may be reduced, especially in the objective lens, to limit reduction of the electric fields.

When the control lens, rather than the condenser lens, is used for opening angle/demagnification correction of the electron beam, the collimator remains at the intermediate focus so there is no need for astigmatism correction of the collimator. In addition, the landing energy can be varied over a wide range of energies whilst maintaining an optimum field strength in the objective lens. This minimizes aberrations of the objective lens. The strength of the condenser lens (if used) is also maintained constant, avoiding any introduction of additional aberrations due to the collimator not being at the intermediate focal plane or to changes in the path of the electron through the condenser lens.

In some embodiments, the charged particle assessment tool further comprises one or more aberration correctors that reduce one or more aberrations in the sub-beams. In some embodiments, each of at least a subset of the aberration correctors is positioned in, or directly adjacent to, a respective one of the intermediate foci (e.g. in or adjacent to the intermediate image plane). The sub-beams have the smallest cross-sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In some embodiments, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses of condenser lens array 231 (e.g. with each such aberration corrector being integrated with, or directly adjacent to, one or more of the condenser lenses 231). This is desirable because at or near the condenser lenses of condenser lens array 231 aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream. The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, each of at least a subset of the aberration correctors is integrated with, or directly adjacent to, one or more of the objective lenses 234. In some embodiments, these aberration correctors reduce one or more of the following: field curvature; focus error; and astigmatism. Additionally or alternatively, one or more scanning deflectors (not shown) may be integrated with, or directly adjacent to, one or more of the objective lenses 234 for scanning the sub-beams 211, 212, 214 over the sample 208. In some embodiments, the scanning deflectors described in US 2010/0276606, which document is hereby incorporated by reference in its entirety, may be used.

In some embodiments, the objective lens array assembly comprises a detector having a detector module 402 downbeam of at least one electrode of the objective lens array 241. The detector module 402 may take the form of a detector array. In some embodiments, at least a portion of the detector is adjacent to and/or integrated with the objective lens array 241. For example, the detector module 402 may be implemented by integrating a CMOS chip detector into a bottom electrode of the objective lens array 241. Integration of a detector module 402 into the objective lens array replaces a secondary column. The CMOS chip is preferably orientated to face the sample (because of the small distance (e.g. 100 m) between wafer and bottom of the electron-optical system). In some embodiments, electrodes to capture the secondary electron signals are formed in the top metal layer of the CMOS device. The electrodes can be formed in other layers. Power and control signals of the CMOS may be connected to the CMOS by through-silicon vias. For robustness, preferably the bottom electrode consists of two elements: the CMOS chip and a passive Si plate with holes. The plate shields the CMOS from high E-fields.

In order to maximize the detection efficiency it is desirable to make the electrode surface as large as possible, so that substantially all the area of the objective lens array (excepting the apertures) is occupied by electrodes and each electrode has a diameter substantially equal to the array pitch. In some embodiments, the outer shape of the electrode is a circle, but this can be made a square to maximize the detection area. Also the diameter of the through-substrate hole can be minimized. Typical size of the electron beam is in the order of 5 to 15 micron.

In some embodiments, a single electrode surrounds each aperture. In some embodiments, a plurality of electrode elements are provided around each aperture. The electrons captured by the electrode elements surrounding one aperture may be combined into a single signal or used to generate independent signals. The electrode elements may be divided radially (i.e. to form a plurality of concentric annuluses), angularly (i.e. to form a plurality of sector-like pieces), both radially and angularly or in any other convenient manner.

However a larger electrode surface leads to a larger parasitic capacitance, so a lower bandwidth. For this reason it may be desirable to limit the outer diameter of the electrode. Especially in case a larger electrode gives only a slightly larger detection efficiency, but a significantly larger capacitance. A circular (annular) electrode may provide a good compromise between collection efficiency and parasitic capacitance.

A larger outer diameter of the electrode may also lead to a larger crosstalk (sensitivity to the signal of a neighboring hole). This can also be a reason to make the electrode outer diameter smaller. Especially in case a larger electrode gives only a slightly larger detection efficiency, but a significantly larger crosstalk.

The back-scattered and/or secondary electron current collected by electrode is amplified by a Trans Impedance Amplifier.

Figure 6:
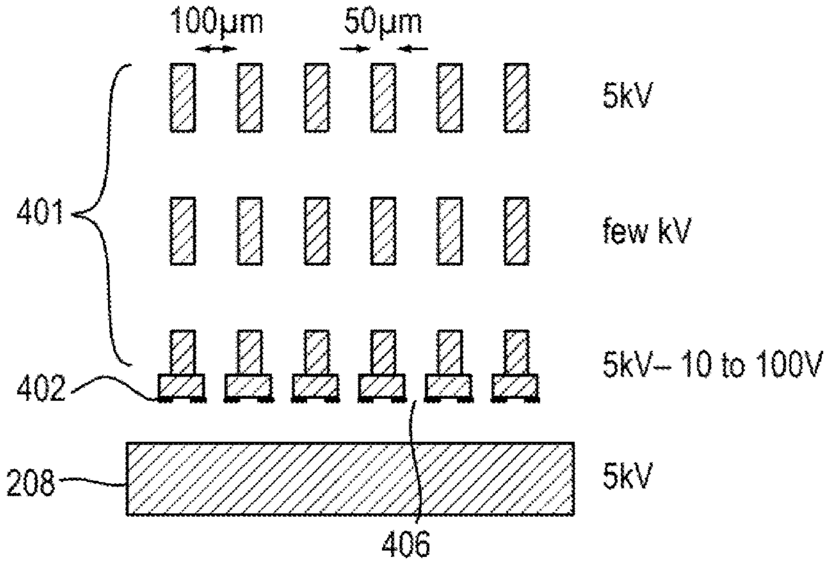
FIG. 6 is a schematic cross-sectional view of a portion of an objective lens array of an exemplary arrangement.
Figure 7:
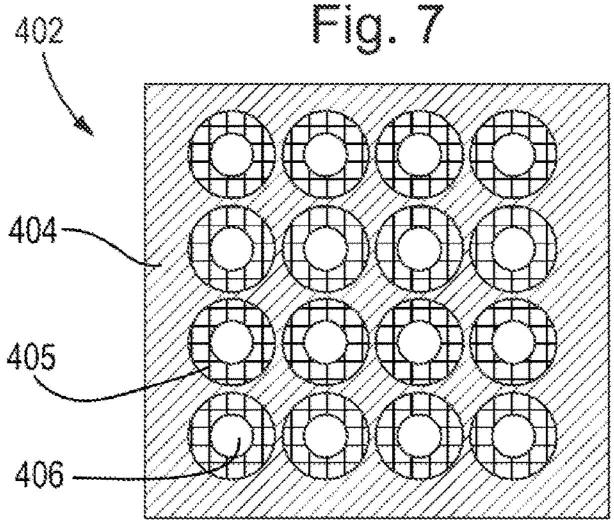
FIG. 7 is bottom view of the portion of the objective lens array of FIG. 6.
Figure 8:
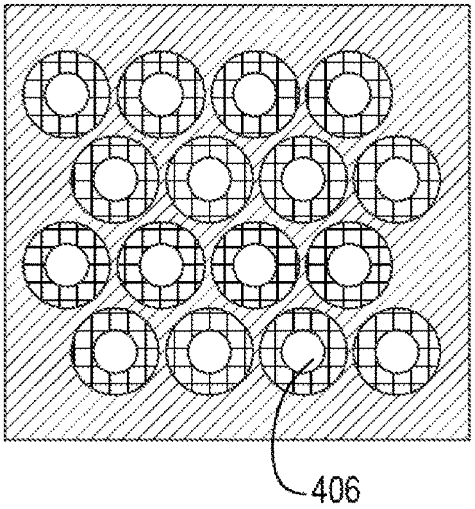
FIG. 8 is a bottom view of a modified version of the portion of the objective lens array of FIG. 6.

An example of a detector integrated into an objective lens array is shown in FIG. 6 which illustrates a portion of a multibeam objective lens 401 in schematic cross section. In this example, the detector comprises a detector module 402 comprising a plurality (e.g. an array) of detector elements 405 (e.g. sensor elements such as capture electrodes) preferably as an array of detector elements (i.e. a plurality of detector elements in a pattern or arrangement preferably over a two dimensional surface). In this example, the detector module 402 is provided on an output side of the objective lens array. The output side is the output side of the objective lens 401. FIG. 7 is a bottom view of detector module 402 which comprises a substrate 404 on which are provided a plurality of capture electrodes 405 each surrounding a beam aperture 406. The beam apertures 406 may be formed by etching through substrate 404. In the arrangement shown in FIG. 7, the beam apertures 406 are shown in a rectangular array. The beam apertures 406 can also be differently arranged, e.g. in a hexagonal close packed array as depicted in FIG. 8.

Figure 9:
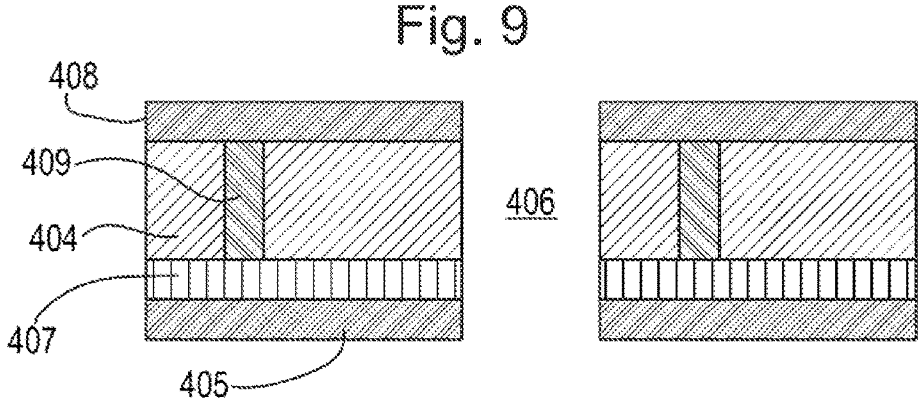
FIG. 9 is an enlarged schematic cross-sectional view of a detector incorporated in the objective lens of FIG. 6.

FIG. 9 depicts at a larger scale a part of the detector module 402 in cross section. Capture electrodes 405 form the bottommost, i.e. most close to the sample, surface of the detector module 402. Between the capture electrodes 405 and the main body of the silicon substrate 404 a logic layer 407 is provided. Logic layer 407 may include amplifiers, e.g. Trans Impedance Amplifiers, analogue to digital converters, and readout logic. In some embodiments, there is one amplifier and one analogue to digital converter per capture electrode 405. A circuit featuring these elements may be comprised in a unit area referred to as a cell that is associated with an aperture. The detector module 402 may have several cells each associated with an aperture; preferably the cells have similar shape. Logic layer 407 and capture electrodes 405 can be manufactured using a CMOS process with the capture electrodes 405 forming the final metallization layer.

A wiring layer 408 is provided on the backside of, or within, substrate 404 and connected to the logic layer 407 by through-silicon vias 409. The number of through-silicon vias 409 need not be the same as the number of beam apertures 406. In particular if the electrode signals are digitized in the logic layer 407 only a small number of through-silicon vias may be required to provide a data bus. Wiring layer 408 can include control lines, data lines and power lines. It will be noted that in spite of the beam apertures 406 there is ample space for all necessary connections. The detector module 402 can also be fabricated using bipolar or other manufacturing techniques. A printed circuit board and/or other semiconductor chips may be provided on the backside of detector module 402.

The integrated detector module 402 described above is particularly advantageous when used with a tool having tunable landing energy as secondary electron capture can be optimized for a range of landing energies. A detector module in the form of an array can also be integrated into other electrode arrays, not only the lowest electrode array. Further details and alternative arrangements of a detector module integrated into an objective lens can be found in EP Application Number 20184160.8, which document is hereby incorporated by reference.

Figure 10:
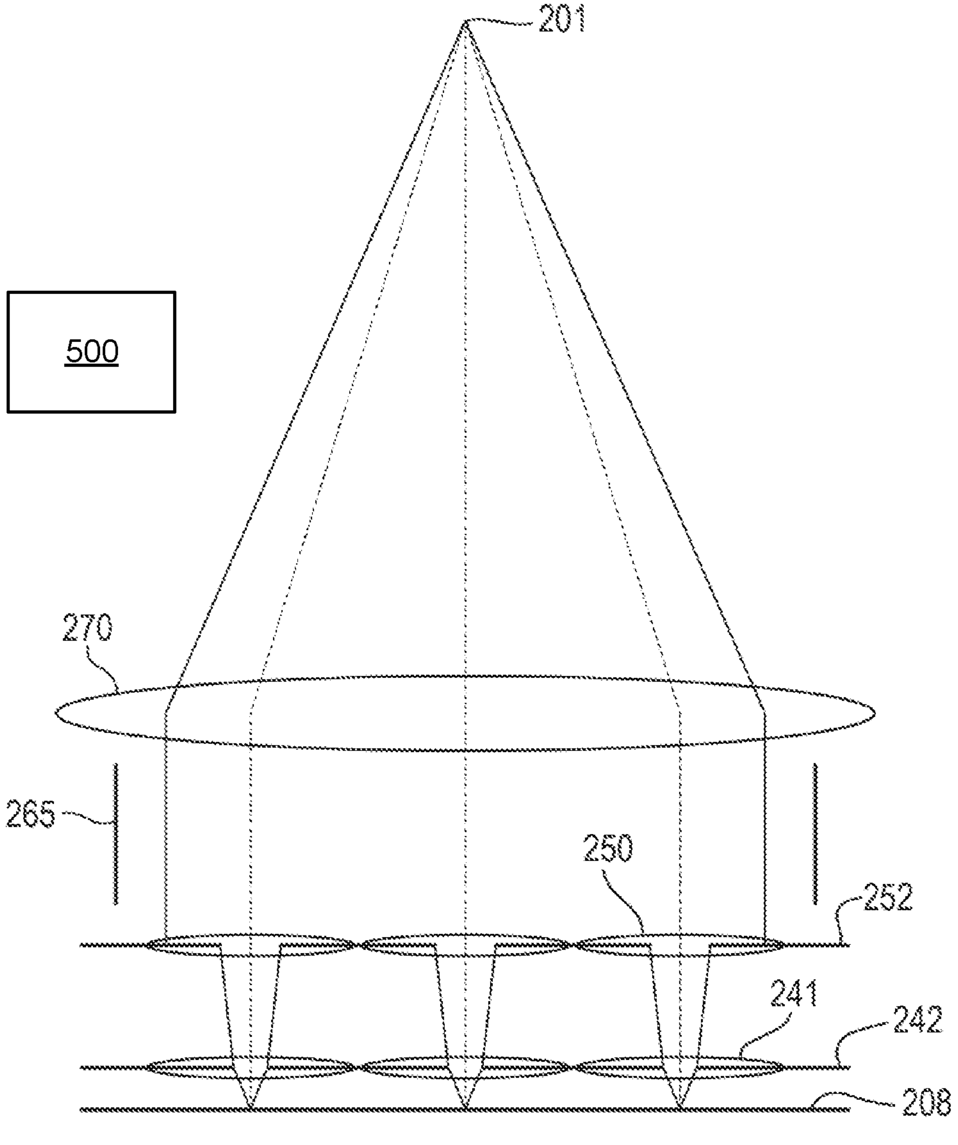
FIG. 10 is a schematic diagram of an exemplary electron-optical column comprising a macro collimator and macro scan deflector.

FIG. 10 is a schematic diagram of a further exemplary electron-optical column for use in an assessment system. The column comprises an objective lens array assembly. The objective lens array assembly comprises an objective lens array 241. The objective lens array 241 comprises a plurality of objective lenses. Each objective lens comprises at least two electrodes (e.g. two or three electrodes) connected to respective potential sources. The objective lens array 241 may comprise two or more (e.g. three) plate electrode arrays connected to respective potential sources. The plate electrode arrays of the objective lens array 241 may be referred to as objective electrodes. Each objective lens formed by the plate electrode arrays may be a micro-lens operating on a different sub-beam or group of sub-beams in the multi-beam. Each plate defines a plurality of apertures (which may also be referred to as holes). The position of each aperture in a plate corresponds to the position of a corresponding aperture (or corresponding hole) in the other plate (or plates). The corresponding apertures define the objective lenses, and each set of corresponding holes therefore operates in use on the same sub-beam or group of sub-beams in the multi-beam. Each objective lens projects a respective sub-beam of the multi-beam onto a sample 208. See also description of objective lens array 234.

In some arrangements, apertures in the objective lens array 241 are adapted to compensate for off-axis aberrations in the multi-beam. For example, the apertures of one or more of the objective electrodes may be shaped, sized and/or positioned to compensation for the off-axis aberrations. The apertures may, for example, have a range of different areas to compensate for field curvature, a range of different ellipticities to compensate for astigmatism, and/or a range of different displacements from nominal grid positions to compensate for distortion caused by telecentricity error. See for example EPA 21166214.3 filed on 31 Mar. 2021 which is hereby incorporated by reference so far as off-axis aberration correction.

The objective lens array assembly further comprises a control lens array 250. The control lens array 250 comprises a plurality of control lenses. Each control lens comprises at least two electrodes (e.g. two or three electrodes) connected to respective potential sources. The control lens array 250 may comprise two or more (e.g. three) plate electrode arrays connected to respective potential sources. The plate electrode arrays of the control lens array 250 may be referred to as control electrodes. The control lens array 250 is associated with the objective lens array 241 (e.g. the two arrays are positioned close to each other and/or mechanically connected to each other and/or controlled together as a unit). The control lens array 250 is positioned up-beam of the objective lens array 241. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array and the objective lens array operate together to provide a combined focal length. Combined operation without an intermediate focus may reduce the risk of aberrations.

In some embodiments, an electron-optical system comprising the objective lens array assembly is configured to control the objective lens assembly (e.g. by controlling potentials applied to electrodes of the control lens array 250) so that a focal length of the control lenses is larger than a separation between the control lens array 250 and the objective lens array 241. The control lens array 250 and objective lens array 241 may thus be positioned relatively close together, with a focusing action from the control lens array 250 that is too weak to form an intermediate focus between the control lens array 250 and objective lens array 241. In other embodiments, the objective lens array assembly may be configured to form an intermediate focus between the control lens array 250 and the objective lens array 241.

In some embodiments, the control lens array is an exchangeable module, either on its own or in combination with other elements such as the objective lens array and/or detector module. The exchangeable module may be field replaceable, i.e. the module can be swapped for a new module by a field engineer. Field replaceable is intended to mean that the module may be removed and replaced with the same or different module while maintaining the vacuum in which the electron-optical tool 40 is located. Only a section of the column corresponding to the module is vented for the module to be removed and returned or replaced.

The control lens array may be in the same module as an objective lens array 241, i.e. forming an objective lens array assembly or objective lens arrangement, or it may be in a separate module.

An electric power source may be provided to apply respective potentials to electrodes of the control lenses of the control lens array 250 and the objective lenses of the objective lens array 241.

The provision of a control lens array 250 in addition to an objective lens array 241 provides additional degrees of freedom for controlling properties of the sub-beams. The additional freedom is provided even when the control lens array 250 and objective lens array 241 are provided relatively close together, for example such that no intermediate focus is formed between the control lens array 250 and the objective lens array 241. The control lens array 250 may be used to optimize a beam opening angle with respect to the demagnification of the beam and/or to control the beam energy delivered to the objective lens array 241. The control lens may comprise 2 or 3 or more electrodes. If there are two electrodes, then the demagnification and landing energy are controlled together. If there are three or more electrodes the demagnification and landing energy can be controlled independently. The control lenses may thus be configured to adjust the demagnification and/or beam opening angle of respective sub-beams (e.g. using the electric power source to apply suitable respective potentials to the electrodes of the control lenses and the objective lenses). This optimization can be achieved with having an excessively negative impact on the number of objective lenses and without excessively deteriorating aberrations of the objective lenses (e.g. without increasing the strength of the objective lenses).

In the example of FIG. 10, the electron-optical system comprises a source 201. The source 201 provides a beam of charged particles (e.g. electrons). The multi-beam focused on the sample 208 is derived from the beam provided by the source 201. Sub-beams may be derived from the beam, for example, using a beam limiter defining an array of beam-limiting apertures. The source 201 is desirably a high brightness thermal field emitter with a good compromise between brightness and total emission current. In the example shown, a collimator is provided up-beam of the objective lens array assembly. The collimator may comprise a macro collimator 270. The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In the example of FIG. 10 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 256 comprises a macroscopic multi-pole deflector, for example with 8 poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). In some arrangements, the scanning of the sub-beams is coordinated with movement of the sample 208. For example, a combination of scanning the sub-beams parallel to the X axis while moving the sample 208 parallel to the Y axis may be repeated at different stepped positions of the sample to process multiple parallel elongate strips on the sample 208. A larger movement of the sample 208 may then be used to leap to a new processing location on the sample 208. An example of this movement is described in EPA 21171877.0, filed 3 May 2021, which is hereby incorporated in so far as the control of the beam scanning with stage movement. The macro scan deflector 265 acts macroscopically on all of the beam rather than comprising an array of deflector elements that are each configured to act on a different individual portion of the beam. In the example shown, the macro scan deflector 265 is provided between the macro collimator 270 and the control lens array 250.

Any of the objective lens array assemblies described herein may further comprise a detector (e.g. comprising a detector module 402). The detector detects charged particles emitted from the sample 208. The detected charged particles may include any of the charged particles detected by an SEM, including secondary and/or backscattered electrons emitted from the sample 208. An exemplary construction of a detector module 402 is described above with reference to FIG. 6 to 9.

In a variation on the example of FIG. 10 the objective lens array assembly may comprise a scan-deflector array. The scan-deflector array comprises a plurality of scan deflectors. Each scan deflector scans a respective sub-beam over the sample 208. The scan-deflector array may thus comprise a scan deflector for each sub-beam. The deflection is such as to cause the sub-beam to be scanned across the sample 208 in the one or two directions (i.e. one dimensionally or two dimensionally). In some embodiments, the scanning deflectors described in EP2425444, which document is hereby incorporated by reference in its entirety specifically in relation to scan deflectors, may be used to implement the scan-deflector array. The scan-deflector array is positioned between the objective lens array 241 and the control lens array 250. The scan-deflector array may be provided instead of the macro scan deflector 265. In other embodiments both the macro scan deflector 265 and the scan-deflector array are provided and may be operated in synchronization. In some embodiments, as exemplified in FIG. 10, the control lens array 250 is the first deflecting or lensing electron-optical array element in the beam path down-beam of the source 201.

A collimator element array may be provided instead of a macro collimator 270. Although not shown, it is also possible to apply this variation to the example of FIG. 3 to provide a macro scan deflector and a collimator element array. Each collimator element collimates a respective sub-beam. The collimator element array may be more spatially compact than a macro collimator 270. Providing the collimator element array and the scan-deflector array 260 together may therefore provide space saving. This space saving is desirable where a plurality of the electron-optical systems comprising the objective lens array assembly are provided in an electron-optical system array. In such an example, there may be no macro condenser lens or a condenser lens array. In this scenario the control lens therefore provides the possibility to optimize the beam opening angle and demagnification for changes in landing energy.

In some embodiments, an electron-optical system array is provided. The array may comprise a plurality of any of the electron-optical systems described herein. Each of the electron-optical systems focuses respective multi-beams simultaneously onto different regions of the same sample. Each electron-optical system may form sub-beams from a beam of charged particles from a different respective source 201. Each respective source 201 may be one source in a plurality of sources 201. At least a subset of the plurality of sources 201 may be provided as a source array. The source array may comprise a plurality of sources 201 provided on a common substrate. The focusing of plural multi-beams simultaneously onto different regions of the same sample allows an increased area of the sample 208 to be processed (e.g. assessed) simultaneously. The electron-optical systems in the array may be arranged adjacent to each other so as to project the respective multi-beams onto adjacent regions of the sample 208. Any number of electron-optical systems may be used in the array. Preferably, the number of electron-optical systems is in the range of from 9 to 200. In some embodiments, the electron-optical systems are arranged in a rectangular array or in a hexagonal array. In other embodiments, the electron-optical systems are provided in an irregular array or in a regular array having a geometry other than rectangular or hexagonal. Each electron-optical system in the array may be configured in any of the ways described herein when referring to a single electron-optical system. As mentioned above, the scan-deflector array 260 and collimator element array 271 are particularly well suited to incorporation into an electron-optical system array because of their spatial compactness, which facilitates positioning of the electron-optical systems close to each other.

Figure 11:
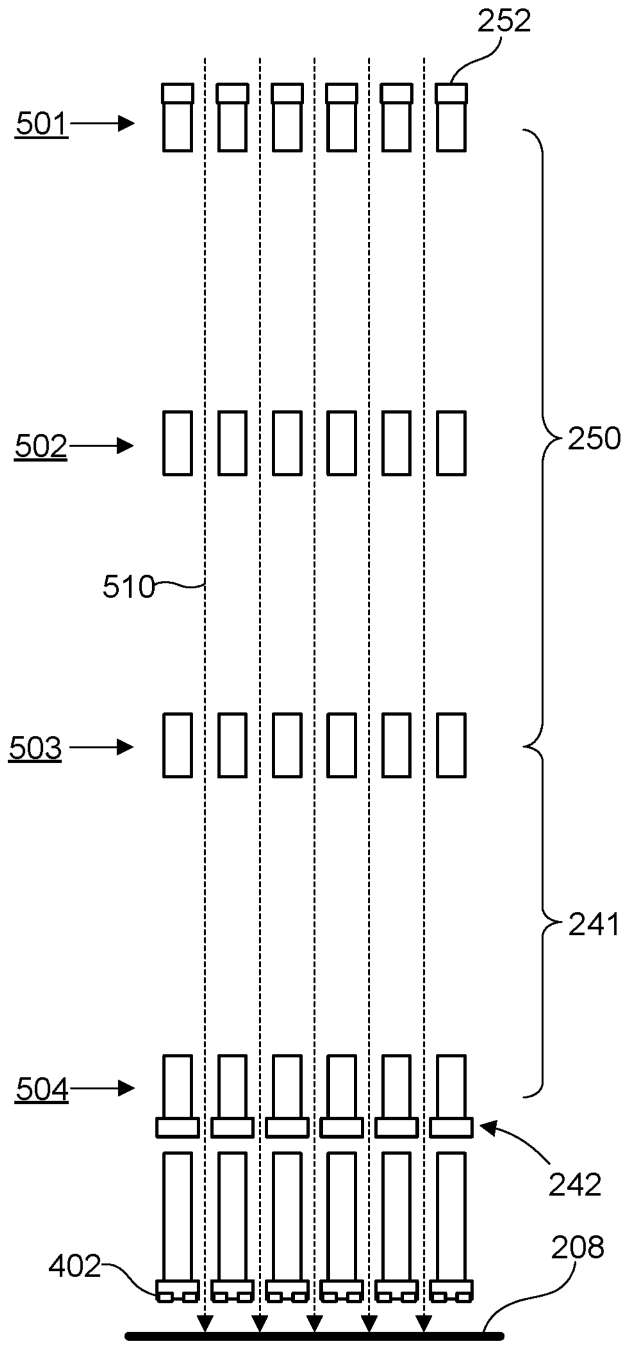
FIG. 11 is a schematic cross-sectional view of portions of a control lens array and an objective lens array of an assessment system.

FIG. 11 depicts a portion of a further example of an objective lens array assembly. The objective lens array assembly comprises a control lens array 250 and an objective lens array 241. This objective lens array assembly could be used in the arrangement of FIG. 10. The control lens array 250 may comprise at least three electrodes. The objective lens array 241 may comprise at least two electrodes. In this example, the objective lens array assembly further comprises a beam shaping limiter 242. The beam shaping limiter 242 defines an array of beam-limiting apertures. The beam shaping limiter 242 may be referred to as a beam shaping-limiting aperture array or final beam-limiting aperture array. The beam shaping limiter 242 may comprise a plate (which may be a plate-like body) having a plurality of apertures. The beam shaping limiter 242 is down-beam from at least one electrode (optionally from all electrodes) of the control lens array 250. In some embodiments, the beam shaping limiter 242 is down-beam from at least one electrode (optionally from all electrodes) of the objective lens array 241. In some embodiments, it can be an array, for example a bottom most array of the objective lens array 241.

In an arrangement, the beam shaping limiter 242 is structurally integrated with an electrode of the objective lens array 241. Each beam-limiting aperture has a beam limiting effect, allowing only a selected portion of the sub-beam incident onto the beam shaping limiter 242 to pass through the beam-limiting aperture 124. The selected portion may be such that only a portion of the respective sub-beam passing through a central portion of respective apertures in the objective lens array reaches the sample 208.

In some embodiments, the electron-optical system further comprises an upper beam limiter 252. The upper beam limiter 252 defines an array of beam-limiting apertures or generates the array of beams for example from a source beam from source 201. The upper beam limiter 252 may comprise a plate (which may be a plate-like body) having a plurality of apertures. The upper beam limiter 252 forms sub-beams from a beam of charged particles emitted by the source 201. Portions of the beam other than those contributing to forming the sub-beams may be blocked (e.g. absorbed) by the upper beam limiter 252 so as not to interfere with the sub-beams down-beam.

The upper beam limiter 252 may form part of the objective lens array assembly. The upper beam limiter 252 may, for example, be adjacent to and/or integrated with the control lens array 250 (e.g. adjacent to and/or integrated with, or even as, an electrode of the control lens array 250 nearest to the source 201). In some embodiments, the upper beam limiter 252 defines beam-limiting apertures that are larger (e.g. have larger cross-sectional area) than beam-limiting apertures of the beam shaping limiter 242. The beam-limiting apertures of the beam shaping limiter 242 may thus be of smaller dimension than the corresponding apertures defined in the objective lens array 241 and/or in the control lens array 250.

The beam shaping limiter 242 is desirably configured to have a beam-limiting effect (i.e. to remove a portion of each sub-beam that is incident on the beam shaping limiter 242). The beam shaping limiter 242 may, for example, be configured to ensure that each sub-beam exiting an objective lens of the objective lens array 241 has passed through the center of the respective objective lens. Further the beam shaping limiter 242 reduces the length over which the scanning operates on the sub-beams. The distance is reduced to the length of the beam path from the beam shaping limiter 242 to the sample surface.

The beam shaping limiter 242 may be formed integrally with a bottom electrode of an objective lens array 241. It is generally desirable to position the beam shaping limiter 242 adjacent to the electrode of each objective lens that has the strongest lensing effect. In an arrangement it is desirable to provide the beam shaping limiter 242 up-beam of a detector module 402 of a detector. Providing the beam shaping limiter 242 up-beam of the detector module 402 ensures that the beam shaping limiter 242 will not obstruct charged particles emitted from the sample 208 and prevent them from reaching the detector module 402. The beam shaping limiter 242 may thus be provided directly adjacent to the detector module 402 in the up-beam direction.

As described above with reference in particular to FIG. 3-5, a control lens array 250 can be used to vary landing energies of sub-beams on a sample 208 over a desired range while maintaining an optimal field within the objective lens array 241. Maintaining an optimum field within the objective lens minimizes aberrations and improves (minimizes) resolution. That is improved resolution here is a reduction the smallest resolvable dimension (size) of sub-beam at the sample. The control lens array 250 may also be used to optimize the beam opening angle and demagnification. A consequence of maintaining the optimum field within the objective lens array 241 while varying the landing energy is that the position of the image plane changes. The change in the position of the image plane means that the sample 208 has to be displaced to maintain correct focus of the sub-beams on the sample 208. The displacement of the sample 208 requires that the detector module 402 for detecting signal electrons emitted from the sample 208 will also have to be displaced, for example to maintain a constant distance between the sample 208 and the detector module 402. These requirements may add extra mechanical and/or operational complexity.

Arrangements are described below that allow landing energies to be controlled without requiring displacement of the sample 208 or a detector module 402, and without requiring replacement of the objective lens array assembly. Arrangements are also described that provide additional degrees of freedom for controlling properties of sub-beams impinging on the sample 208.

An assessment system is provided that directs charged particles in sub-beams towards a sample 208. The assessment system detects signal electrons emitted from the sample 208 (e.g. using the detector module 402) to obtain information about the sample 208. The sub-beams are arranged in a multi-beam (which may also be referred to as a multi-beam array). The system comprises a control lens array 250. The control lens array 250 may take any of the forms described with reference to FIGS. 3, 5 and 10 (described above) and 11 (described above and more especially below). The system comprises an objective lens array 241. The objective lens array 241 may take any of the forms described with reference to FIGS. 3, 5-10 (described above) and 11 (described below).

FIG. 11 is a schematic side sectional view of a portion of an exemplary control lens array 250 and objective lens array 241. As depicted in FIG. 11, the control lens array 250 may be defined by plurality of control electrodes 501-503. Each control electrode 501-503 may comprise a plate-like element with an aperture for each sub-beam path 510 (forming an array of apertures). The objective lens array 241 may be defined by a plurality of objective electrodes 503-504. Each objective electrode 503-504 may comprise a plate-like element with an aperture for each sub-beam path 510 (forming an array of apertures). The control electrodes 501-503 and the objective electrodes 503-504 may be referred to as lens electrodes. The combination of the control lens array 250 and objective lens array 241 may comprise at least four such lens electrodes. The lens electrodes may be arranged orthogonal to and/or in series along sub-beam paths 510 of the multi-beam.

Five exemplary sub-beam paths 510 are shown in FIG. 11. The control electrodes 501-503 are arranged in series along the sub-beam paths 510 and define respective apertures aligned with the sub-beam paths 510 to define the control lenses. Each control lens is thus aligned with a sub-beam path 510 of a respective sub-beam and operates on (e.g. electrostatically manipulates) the sub-beam. Each control electrode 501-503 may operate on a portion of the sub-beams or on all of the sub-beams. Each objective lens in the objective lens array 241 may be aligned with a sub-beam path 510 aligned with a respective control lens. The objective lens array 241 directs the sub-beams onto the sample 208.

The arrangement may be described as four or more lens electrodes that are plates. In the plates are defined apertures, for example as aperture arrays, that are aligned with a number of beams in a corresponding beam array. The electrodes may be grouped into two or more electrodes, for example to provide a control electrode group, and an objective electrode group. In an arrangement the objective electrode group has at least three electrodes and the control electrode group has at least two electrodes.

In the example of FIG. 11, the objective electrode 503 furthest from the sample 208 (which may be referred to as the up beam most electrode of the objective lens array 641) and the control electrode 503 closest to the sample 208 (which may be referred to as the down beam most electrode of the control lens array 250) are provided by a common electrode. Thus, the up beam most electrode of the objective electrode group is the common electrode being also a member of the control electrode group. The surface of the common electrode 503 facing away from the sample 208 (which may be described as an up beam surface) contributes functionality to the control lens array and may therefore be considered as comprising part of the control lens array. The surface of the common electrode 503 facing towards the sample 208 (which may be referred to as a down beam surface) contributes functionality to the objective lens array 241 and may therefore be considered as comprising part of the objective lens array 241.

The provision of a common electrode is beneficial where it is desirable for the control lens array 250 to be positioned close to the objective lens array 241. This is more likely to be the case in arrangements where an array of scan deflectors 260 is not used, for example where a macro scan deflector 265 is used instead. This is because where an array of scan deflectors 260 is used it is desirable to position the array of scan deflectors 260 between the control lens array 250 and the objective lens array 241, for example to make a distance between the scanning deflector 260 and the objective lens array 241 as short as possible. An arrangement with a macro scan deflector 265 is exemplified in FIG. 10. It is noted, however, that variations on the arrangement of FIG. 10 are possible that still do not have a condenser lens array but do have an array of scan deflectors. In such arrangements it may also be desirable to position the array of scan deflectors between a control lens array and an objective lens array. Alternatively, the array of scan deflectors could be positioned elsewhere, such as within the control lens array or upbeam of the control lens array, such as between the control lens array and an array of beam-limiting apertures.

The assessment system comprising the control lens array 250 and the objective lens array 241 is configured to perform various functions as described below. These functions may be performed by controlling the control lens array 250 and the objective lens array 241. The assessment system may thus comprise a controller 500 (as depicted schematically in FIGS. 3 and 10). As described below, the controller 500 may be computer-implemented, with any suitable combination of elements (e.g. CPUs, RAM, etc.) being used to provide the required functionality. As described above with reference to FIG. 5, the control electrodes and objective electrodes may be controlled by connecting the electrodes to potential sources. The controller 500 may thus comprise and/or control the potential sources that apply potentials to the different lens electrodes.

Any reference herein to the assessment system (or simply system) being configured to perform functionality is intended to encompass the case where the controller 500 is configured to perform the functionality (e.g. by being suitably programmed to provide the necessary control signals to apparatus such as the potential sources).

In some arrangements, the system (e.g. via controller 500) is configured to implement a plurality of selectable landing energies for a sub-beam (optionally for all of the sub-beams) of the multi-beam. The plurality of selectable landing energies are implemented by applying corresponding potentials to the control electrodes 501-503 and the objective electrodes 503-504 (e.g. via respective potential sources). Different potentials may be applied for each selectable landing energy. The system thus allows different landing energies to be selected for a sub-beam at different corresponding times.

The selectable landing energies may comprise one or more continuous ranges of landing energies. In this case, the system would be able to select any landing energy within the one or more continuous ranges. Alternatively or additionally, the selectable landing energies may comprise a plurality of predetermined discrete landing energies. The selection may be performed by a user. The system may thus receive user input (e.g. via a user interface of a computer system or as an input data stream) and select a selectable landing energy based at least partially (i.e. wholly or partly) on the received user input. Alternatively or additionally, the system may operate at least partially (i.e. wholly or partly) automatically. The system may for example select landing energies based at least partially on a predefined program or in response to one or more input parameters, for example determined by an application or model. The input parameters may represent measurements made by the system for example.

The selection of a landing energy may depend on the particular inspection scenario. For example, the landing energy may be selected to optimize secondary electron yield and contrast (which may be defined as the yield difference between a feature and the background). The landing energy that achieves this will be a function of the material being inspected. The nature of the defect of interest may also play a role. Where physical defects are of interest, the material properties will determine secondary electron yield. Where voltage contrast defects are of interest, the charging behavior and therefore secondary electron yield will depend on whether the circuit is able to drain charge. Alternatively or additionally, the landing energy may be selected to control charging (which has an influence on distortion as well as secondary electron yield). Alternatively or additionally, the landing energy may be selected to achieve a desired electron-optical performance. For example, a deterioration of resolution caused by selecting a lower landing energy may be traded off against an improvement in secondary electron yield.

The system is configured (e.g. via controller 500) to select the corresponding potentials for the different landing energies such that a spatial relationship between an image plane of the system and all of the control electrodes 501-503 and objective electrodes 503-504 is the same for each of the selectable landing energies. Thus, the separations between all of the electrodes and between each of the electrodes and the image plane of system remains the same regardless of which selectable landing energy is implemented. A user may therefore choose different landing energies without needing to adjust positions of any of the electrodes 501-504, the sample 208, or the detector module 402.

In some arrangements, the system is configured (e.g. via controller 500) to apply the same potential to the control electrode 501 furthest from the sample 208 (and part of the control lens that is aligned with the sub-beam path of the sub-beam for which the landing energy is being selected) for at least a portion of the selectable landing energies. The potential applied to the control electrode 501 may, for example, be determined by the beam energy delivered by a source module. The source module provides the charged particle beam from which the sub-beams are derived. The control electrode 501 may for example be fixed at a potential corresponding to a beam energy between 10 keV and 50 keV.

In some arrangements, the system is configured (e.g. via controller 500) to apply a different potential to the objective electrode 503 furthest from the sample 208 (and part of the objective lens that is aligned with the sub-beam path of the sub-beam for which the landing energy is being selected) for each of at least a portion of the selectable landing energies. Each potential may, for example, be selected to provide the same distance between the objective electrode 503 and an image plane of the system. The potential applied to the objective electrode 503 determines the field strength of the electric field in the objective lens array 241 and, therefore, the focal length of each objective lens. It is therefore possible to control the position of the image plane by controlling the potential applied to the objective electrode 503.

In some arrangements, the system is configured (e.g. via controller 500) to control the landing energy (i.e. to select a desired landing energy from a range of available selectable landing energies) by controlling at least a potential applied to the objective electrode 504 closest to the sample (and part of the objective lens that is aligned with the sub-beam path of the sub-beam for which the landing energy is being selected). For example, the objective electrode 504 may be set to a potential corresponding to a beam energy equal to the desired landing energy+a predetermined offset. The predetermined offset may for example be in the range of −50 eV to 300 eV. The offset is used to set the electric field strength at the sample surface. The electric field strength plays a role in determining secondary electron contrast, especially for voltage contrast use cases. Where secondary electrons are to be detected, the offset voltage may typically be about 50V or higher to ensure adequate detection efficiency, although lower offset voltages may be adequate if the distance between a detector and the sample is sufficiently small. A negative voltage is used if it is desired to repel the secondary electrons, for example if one is interested in the back scatter signal.

In some arrangements, the system is configured (e.g. via controller 500) to control the control lens array 250 to minimize resolution for each of the plurality of selectable landing energies. This may be achieved at least partly by adjusting the control lens array 250 at each selectable landing energy to keep the demagnification of the system (from electron source to sample) divided by the angular demagnification of the system the same for each of the selectable landing energies. This may be achieved, for example, by controlling a potential applied to an intermediate, preferably middle, control electrode 502 of the control lens array 250 (e.g. where the control lens array 250 is defined by three control electrodes 501-503; noting the intermediate electrode can only be the middle control electrode of a lens array with an odd-number of electrodes). Controlling the potential applied to an intermediate, preferably the middle, control electrode 502 controls the demagnification. Keeping the demagnification divided by angular demagnification the same for the different landing energies ensures that off-axis aberrations remain constant. Hardcoded corrections for the off-axis aberrations therefore remain valid, thereby keeping net aberrations (after the corrections) low for the different landing energies. This is achieved without needing to exchange respective objective electrodes or the objective lens array 241, which may undesirably introduce down-time and/or inconvenience.

Figure 12:
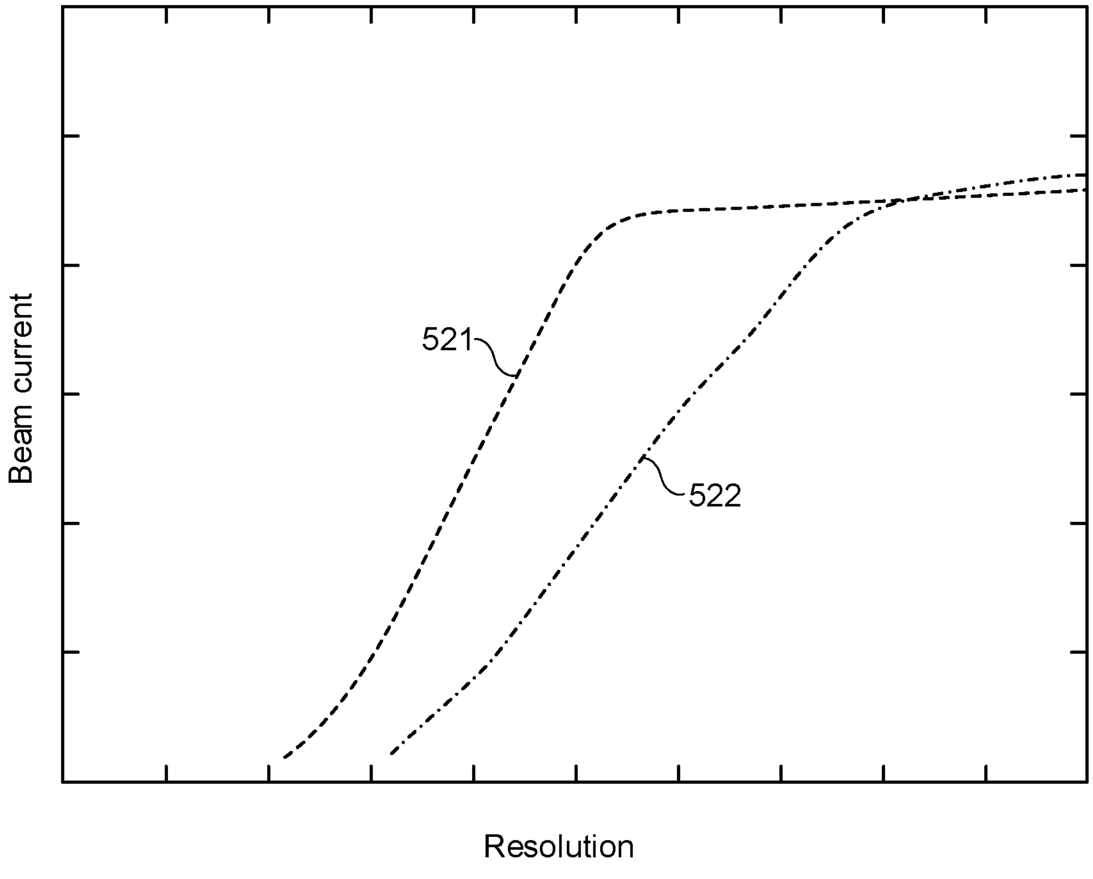
FIG. 12 is a graph of beam current versus resolution showing curves of minimized resolution for two different landing energies.

FIG. 12 is a graph showing predicted variation of beam current of the sub-beams against sub-beam resolution at the sample 208 for a system using an electron-optical column without a condenser lens array, for example as depicted in FIG. 10 featuring a macro-condenser lens. The resolution (i.e. the smallest resolvable dimension of sub-beam at the sample, as described above) has units of distance, for example nanometers. This comment relates other representations that relate to resolution (or the smallest resolvable size of the beam on the sample) referenced for other figures, for example FIGS. 13, 14 and 16, The curves, i.e. in the graph of FIG. 12, are obtained by simulating the electrostatic field and ray tracing electrons through the field. Curve 521 corresponds to a landing energy of 2.5 keV. Curve 522 corresponds to a landing energy of 1 keV. For each curve, each distinct point on the curve represents a distinct physical configuration of the electron-optical column that is optimized for the respective combination of beam current and resolution (including, for example, hard coded off-axis compensations). It is normally desirable for the total current to be high to achieve good throughput and for the resolution to be minimized to provide measurements with good spatial resolution. The graph shows that a balance needs to be achieved between the two quantities: increasing the beam current increases the resolution and vice versa. The curve of beam current against resolution is furthermore different for the different landing energies.

Figure 13:
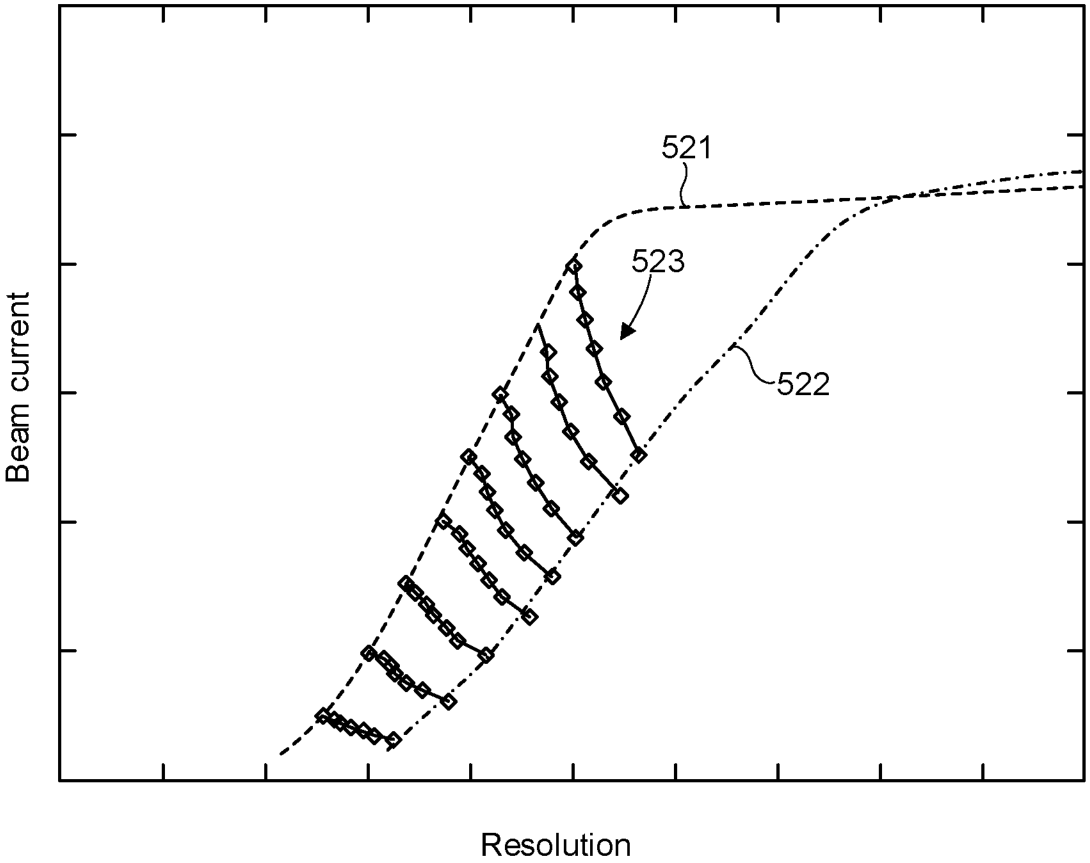
FIG. 13 is the graph of FIG. 12 additionally showing curves in which landing energy is stepped from 2.5 keV to 1 keV with fixed image plane and at minimized resolution for each of eight different physical configurations of the system.
Figure 14:
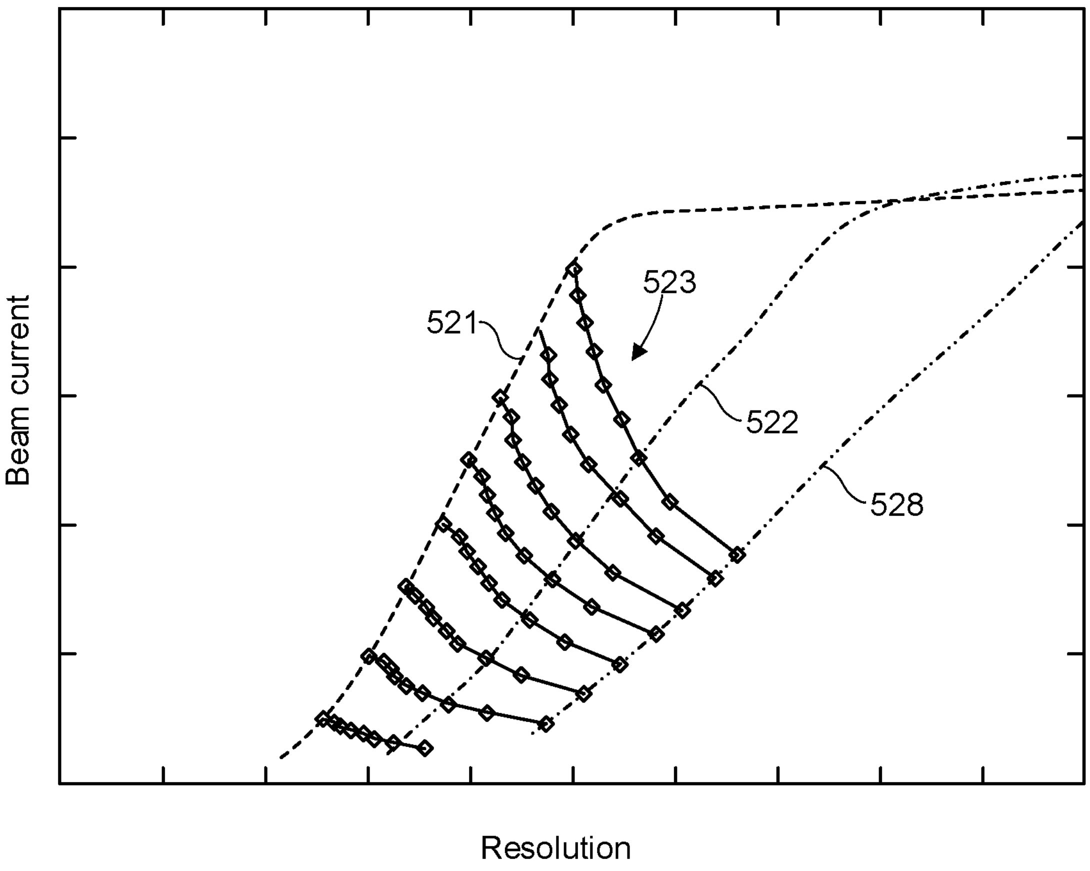
FIG. 14 is the graph of FIG. 13 extended to go down to a landing energy of 0.5 keV.

FIG. 13 is a graph showing eight example curves (solid line curves 523 with open squares) illustrating selection of different landing energies in eight different physical configurations of the column. For each configuration, represented by a respective one of the curves 523, plural different landing energies are selected between the landing energy of 2.5 keV corresponding to curve 521 and the landing energy of 1 keV corresponding to curve 522 in steps of 250 eV. At each selected landing energy, the system controls the control lens array 250 to minimize resolution by changing the demagnification of the control lens array 250. This may be achieved, for example, by keeping the demagnification of the system divided by angular demagnification of the system constant to ensure the hard coded off-axis aberration compensations remain valid and/or by varying the demagnification of the control lens array to compensate for other effects such as changes in field curvature caused by distortion of elements (e.g. electrodes) caused by the electric fields. In each case, potentials applied to the control electrodes and the objective electrodes were also selected to maintain the same spatial relationship between an image plane and all of the control electrodes and objective electrodes. Each curve 523 thus shows a range of different landing energies and corresponding beam currents and minimized resolution that are made available. FIG. 14 is a graph showing an extension of the functionality to a landing energy of 0.5 keV (curve 528).

Figure 15:
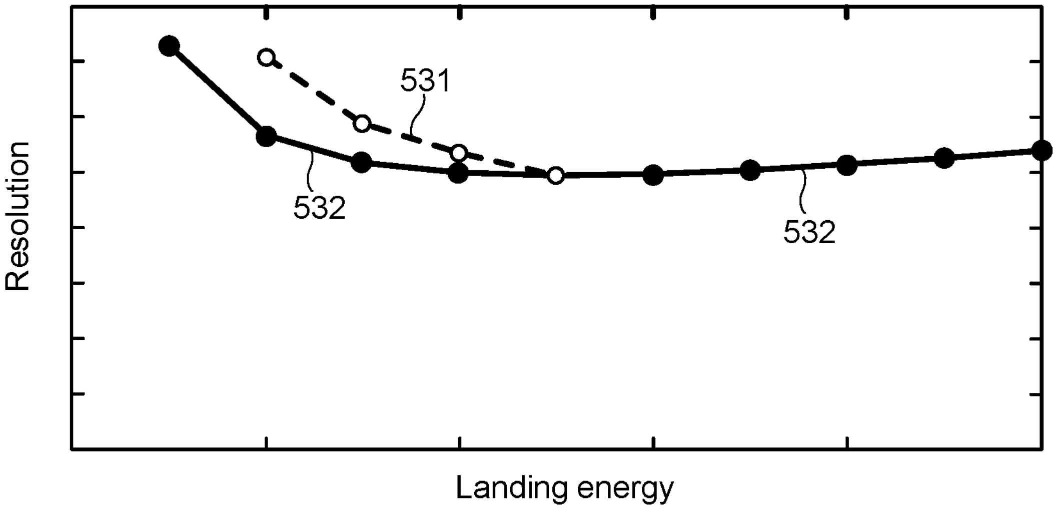
FIG. 15 is a graph showing resolution performance as a function of landing energy for the case where the image plane is fixed compared to the case where the image plane is moveable.

FIG. 15 is a graph comparing resolution performance as a function of landing energy for two use cases of an arrangement with condenser lens array, such as that depicted in FIG. 3. It is noted that in arrangements of this type the beam limiting aperture that generates the sub-beams is up beam of the control lens array 250, which means that the beam current is not influenced by the control lens array 250 (in contrast to the situation for arrangements without the condenser lens array, such as that of FIG. 10). For this reason, the data is not plotted as a function of beam current. The first use case is where a spatial relationship between an image plane of the system and all of the control electrodes and objective electrodes is kept the same over a range of landing energies (curve 531), in accordance with the above-described arrangements. The curve 531 exists only for a lower portion of the range of landing energies because for higher landing energies the electrostatic field would have to be increased to higher than practicable levels. The second use case is where the image plane is allowed to move (with corresponding movement of the sample and detector module) to allow optimal resolution (curve 532) as depicted in the graph of FIG. 4. (Note that optimal resolution is the smallest resolvable dimension of a sub-beam at the sample; for example a minimized resolution is a minimized resolved dimension of the sub-beam at the sample.) Curves 531 and 532 are seen to diverge, with curve 531 showing lower resolution performance. However, the difference in performance is not very large while the complexity of the system is greatly simplified. (Note resolution performance relates to the resolvable dimension or size of a sub-beam at the sample; so that improved performance may achieve a smaller resolved dimension of the sub-beam at the sample. A lower resolution performance relates a larger resolved dimension of the sub-beam at the sample).

In some arrangements, in contrast to the situation exemplified in FIGS. 13 and 14, the resolution is deliberately not minimized. The removal of this restriction allows a range of different beam currents to be selected for each selectable landing beam energy. Thus, instead of being restricted to having the beam current correspond to one of the curves 523 in FIG. 13 or 14, the beam current can take other values. Higher beam currents may be selected at the expense of larger (less optimal) resolution. By allowing the beam current to be varied in this manner, the system thus provides a plurality of selectable beam currents of the sub-beam for each of one or more of the selectable landing beam energies. Thus, in exchange for operating at a larger resolution the beam current may be selected from a range of selectable beam currents at a selected landing beam energy.

Figure 16:
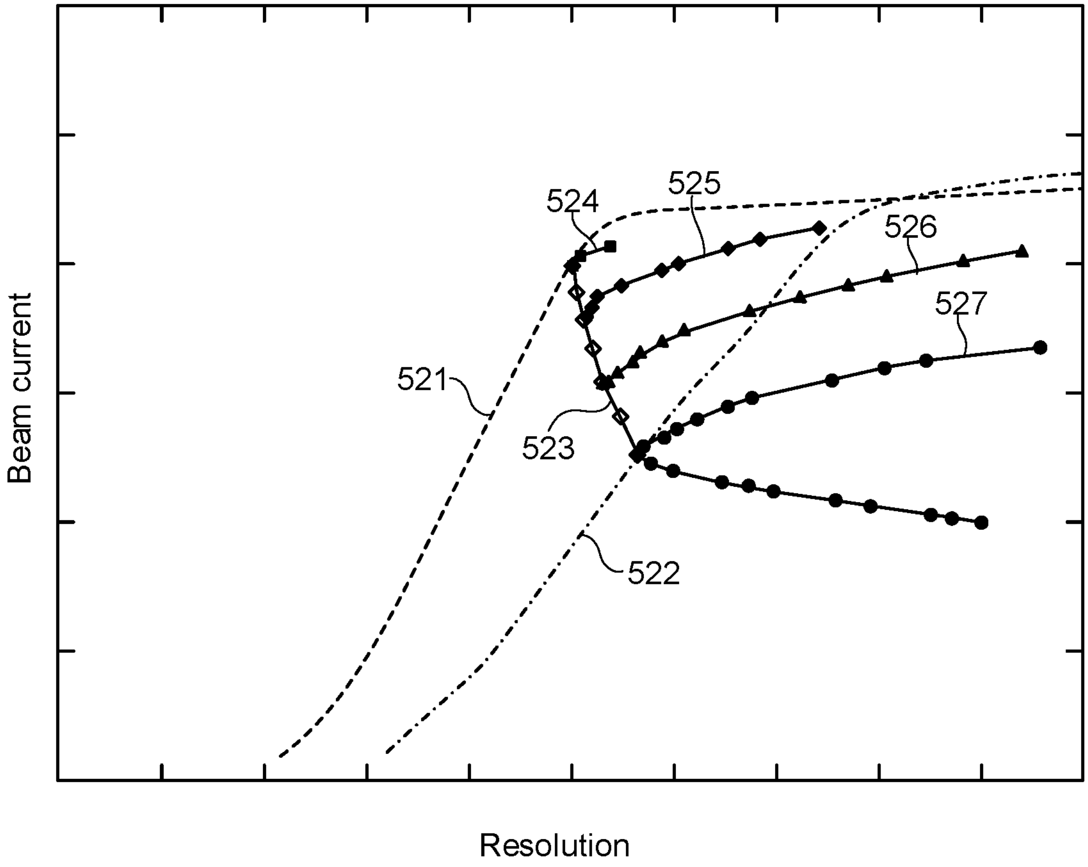
FIG. 16 is the graph of FIG. 13 with a curve of stepped landing energy at fixed image plane position being shown for one of the physical configurations of the system and with additional curves showing variation of beam current achieved by controlling demagnification.

FIG. 16 is a graph showing four example curves (solid line curves 524-527) showing how the beam current can be varied in the manner described above. Each curve 524-527 corresponds to a different landing energy (524=2.5 keV, 525=2.0 keV, 526=1.5 keV, 527=1 keV) but the same physical configuration (same aperture diameter and hard-coded off-axis corrections) and the same image plane. Each curve 524-527 has a 90 degrees rotated parabolic-like form. In curve 527, both the upper and lower branches of the parabola are shown. In curves 524-526, only the upper branch is shown for clarity (i.e. the branch where beam current increases with increasing resolution), although both branches exist. The system may be configured to implement each selectable beam current by selecting a corresponding demagnification of the control lens array 250. Each demagnification corresponds to a different beam current. In the example of FIG. 16, the different points on each of the curves 524-527 correspond to different demagnifications. The demagnification may be adjusted for each curve 524-527 to optimize resolution. The resolution/current value with optimized resolution (for a given landing energy) is the point on curve 523 shown in FIG. 14. Alternatively, the demagnification may be adjusted to allow resolution to deteriorate while achieving a larger beam current. As described above, in a case where the control lens array 250 comprises three control electrodes 501-503, each demagnification may be selected by applying a corresponding potential to the middle electrode 502 of the three control electrodes 501-503. Thus, the system may be configured to implement each selectable beam current by applying a corresponding potential to the middle electrode 502 of the three control electrodes 501-503.

It is desirable for charged particle assessment systems, including any of the systems described above, to be able to selectively turn off one or more (or all) of the sub-beams. This may be desirable for example during exchange of a sample 208, during alignment procedures, or during long movements of the sample 208. It is undesirable to turn off sub-beams by switching off the charged particle source, for example by making an anode potential equal to a cathode potential in the source, or by lowering a temperature of the source. Such action could lead to source instabilities where a source tip shape is a function of both extraction field and temperature. An alternative approach is to deflect sub-beams so that they do not pass through an aperture down beam of the source. The structure defining the aperture then blocks the sub-beams and acts as a blanker. In some arrangements, the deflected sub-beams can cause local surface potential changes (which may be referred to as exposure fingerprints) in the structure providing the blanking functionality. The local surface potential changes can be significant enough (e.g. of the order of 1V) and close enough to apertures that sub-beams will be influenced when the system is turned back on.

Systems are described above that have electron-optical columns with both a control lens array 250 and an objective lens array 241. The control lens array 250 may be used in such systems to provide additional degrees of freedom to modify the overall demagnification and to support changing the landing energy. Such control lens arrays 241 are not typically operated at the limit of maximum allowed electrostatic field strengths, which may allow the control lens arrays 241 to be operated to provide a blocking mode.

Thus, an assessment system may be provided that is configured to direct charged particles in sub-beams arranged in a multi-beam towards a sample 208. The assessment system may comprise a series of lens electrodes arranged along the beam path to provide for example a control lens array 250 and an objective lens array 241 according to any of the configuration described above, for example with reference to FIG. 3-11. In an arrangement, the system is configured (e.g. via a controller 500) to apply a blocking mode by application of a blocking potential within one or more of the control lens of the control lens array 250. The blocking potential is such as to cause charged particles entering the one or more control lenses towards the sample 208 to be electrostatically reflected away from the sample 208. (Note: to select one or some of the lenses of the lens array at least one of the lens electrodes is a plurality of electrodes on a plate of which one of the electrodes may operate on one or more of the lenses in the array). The blocking potential switches off the sub-beam corresponding to each control lens where the blocking potential is applied. This functionality may also be referred to as blanking. If the blocking potential is applied to all of the control lenses (i.e. to the whole control lens array), all of the multi-beams may be switched off. This approach allows sub-beams to be switched off quickly and easily with a lower or negligible risk of exposure fingerprint effects because the sub-beams are not deflected into structure near apertures through which sub-beams will propagate when they are switched back on.

In arrangements where the control lens array 250 comprises three control electrodes 501-503 aligned with the sub-beam path of each sub-beam, the system may apply the blocking potential to at least the middle electrode 502 of the three control electrodes 501-503. The control electrode 501 further from the sample 208 may be less suitable because a potential applied to this electrode may be determined by the beam energy delivered by a source module. The control electrode 503 closer to the sample 208 may be less suitable because it may be shared with the objective lens array and may therefore be at maximum field strength or alternatively it shares the same potential as the most up-beam lens electrode of the objective lens array and objective lens group. In arrangements where the control lens array 250 comprises two control electrodes aligned with the sub-beam path of each sub-beam, the system may apply the blocking potential to the control electrode closest to the sample 208.

The blocking functionality causes electrons to be reflected away from the sample and some of these electrons may pass back through an array of beam limiting apertures towards the source. However, the proportion of the electrons from the source that are reflected back to the source will be relatively low, due for example to the filtering effect of the beam limiting apertures in both directions, and any effects on the source are expected to be negligible.

References to upper and lower, up and down, above and below, etc. in relation to embodiments containing or using a particle trap should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

The embodiments herein described may take the form of a series of aperture arrays or electron-optical elements arranged in arrays along a beam or a multi-beam path. Such electron-optical elements may be electrostatic. In some embodiments, all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques). Electron-optical elements may have magnetic elements and electrostatic elements. For example, a compound array lens may feature a macro magnetic lens encompassing the multi-beam path with an upper and lower pole plate within the magnetic lens and arranged along the multi-beam path. In the pole plates may be an array of apertures for the beam paths of the multi-beam. Electrodes may be present above, below or between the pole plates to control and optimize the electromagnetic field of the compound lens array.

Where electrodes are provided that can be set to different potentials relative to each other it will be understood that such electrodes will be electrically isolated from each other. If the electrodes are mechanically connected to each other, electrically insulating connectors may be provided. For example, where electrodes are provided as a series of conductive plates that each define an aperture array, for example to form an objective lens array or control lens array, electrically insulating plates may be provided between the conductive plates. The insulating plates may be connected to the conductive plates and thereby act as insulating connectors. The conductive plates may be separated from each other along sub-beam paths by the insulating plates.

An assessment tool or assessment system according to the disclosure may comprise apparatus which makes a qualitative assessment of a sample (e.g. pass/fail), one which makes a quantitative measurement (e.g. the size of a feature) of a sample or one which generates an image of map of a sample. Examples of assessment tools or systems are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools).

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g. voltage supplies) to control the component to manipulate the charged particle beam in this manner. For example, a voltage supply may be electrically connected to one or more components to apply potentials to the components, such as to the electrodes of the control lens array 250 and objective lens array 241, under the control of the controller or control system or control unit. An actuatable component, such as a stage, may be controllable to actuate and thus move relative to another components such as the beam path using one or more controllers, control systems, or control units to control the actuation of the component.

Functionality provided by the controller or control system or control unit may be computer-implemented. Any suitable combination of elements may be used to provide the required functionality, including for example CPUs, RAM, SSDs, motherboards, network connections, firmware, software, and/or other elements known in the art that allow the required computing operations to be performed. The required computing operations may be defined by one or more computer programs. The one or more computer programs may be provided in the form of media, optionally non-transitory media, storing computer readable instructions. When the computer readable instructions are read by the computer, the computer performs the required method steps. The computer may consist of a self-contained unit or a distributed computing system having plural different computers connected to each other via a network.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

According to some embodiments of the present disclosure, there is provided an assessment system configured to direct charged particles in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller, wherein the controller is configured to provide a plurality of selectable beam currents of a sub-beam, and to implement each selectable beam current by selecting a corresponding demagnification of the control lens array; and/or the controller is configured to: —implement a plurality of selectable landing energies for a sub-beam of the multi-beam by applying corresponding potentials to the control electrodes and the objective electrodes; and—on implementation of the selected landing energies apply potentials to the control electrodes to select corresponding minimized resolutions of the sub-beam on the sample.

According to some embodiments of the present disclosure, there is provided an assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller configured to apply a blocking mode by application of a blocking potential within one or more of the control lenses, the blocking potential being such as to cause charged particles entering the one or more control lenses towards the sample in use to be electrostatically reflected away from the sample.

According to some embodiments of the present disclosure, there is provided an assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller, wherein: the controller configured to maintain a fixed spatial relationship between an image plane of the system and all of the control electrodes and objective electrodes; and i) the control lens array is configured to be controllable to minimize the resolution of the multi-beam at the sample; ii) the controller is configured to control the control lens array so as to minimize the resolution of the multi-beam at the sample; and/or iii) the controller is configured to apply to the control electrodes and the objective electrodes selected potentials to control the control lens array so as to minimize the resolution of the multi-beam at the sample.

According to some embodiments of the present disclosure, there is provided a method of assessing a sample by directing charged particles in sub-beams arranged in a multi-beam towards the sample using a system comprising: a plurality of control electrodes defining a control lens array, each control lens in the control lens array configured to operate on a respective sub-beam; and a plurality of objective electrodes defining an objective lens array configured to direct the sub-beams onto a sample, and each objective lens configured to operate on a sub-beam from a respective control lens of the control lens array, the method comprising: selecting for a sub-beam of the multi-beam a plurality of different landing energies at different times, each landing energy being selected by applying corresponding potentials to the control electrodes and the objective electrodes, wherein the corresponding potentials are selected such that a spatial relationship between an image plane of the system and all of the control electrodes and objective electrodes is the same for each of the different landing energies.

According to some embodiments of the present disclosure, there is provided a method of using an assessment system that directs charged particles in sub-beams arranged in a multi-beam towards a sample, the system comprising control electrodes for operating on a multi-beam of sub-beams and objective electrodes for focusing the sub-beams onto an image plane, the image plane of the system and all of the control electrodes and objective electrodes having a fixed spatial relationship, the method comprising: implementing a plurality of selectable landing energies for a sub-beam of the multi-beam, the implementing comprising applying corresponding potentials to the control electrodes and the objective electrodes; and selecting the corresponding potentials given the fixed spatial relationship.

According to some embodiments of the present disclosure, there is provided a method of assessing a sample by directing charged particles in sub-beams arranged in a multi-beam towards the sample using a system comprising: a plurality of control electrodes defining a control lens array, each control lens in the control lens array configured to operate on a respective sub-beam; and a plurality of objective electrodes defining an objective lens array configured to direct the sub-beams onto a sample, and each objective lens configured to operate on a sub-beam from a respective control lens of the control lens array, the method comprising: selecting for a sub-beam of the multi-beam a plurality of different beam currents at different times, each beam current being implemented by selecting a corresponding demagnification of the control lens array; and/or implementing a plurality of selectable landing energies for a sub-beam of the multi-beam by applying corresponding potentials to the control electrodes and the objective electrodes, potentials to the control electrodes being selected to minimize resolution of the sub-beam on the sample.

According to some embodiments of the present disclosure, there is provided a method of assessing a sample by directing charged particles in sub-beams arranged in a multi-beam towards the sample using a system comprising: a plurality of control electrodes defining a control lens array, each control lens in the control lens array configured to operate on a respective sub-beam; and a plurality of objective electrodes defining an objective lens array configured to direct the sub-beams onto a sample, and each objective lens configured to operate on a sub-beam from a respective control lens of the control lens array, the method comprising: applying a blocking mode by application of a blocking potential within one or more of the control lenses, the blocking potential being such as to cause charged particles entering the one or more control lenses towards the sample to be electrostatically reflected away from the sample.

According to some embodiments of the present disclosure, there is provided a method of assessing a sample by directing charged particles in sub-beams arranged in a multi-beam towards the sample using a system comprising: a plurality of control electrodes defining a control lens array, each control lens in the control lens array configured to operate on a respective sub-beam; and a plurality of objective electrodes defining an objective lens array configured to direct the sub-beams onto a sample, and each objective lens configured to operate on a sub-beam from a respective control lens of the control lens array, the method comprising: while maintain a fixed spatial relationship between an image plane of the system and all of the control electrodes and objective electrodes: controlling the control lens array to minimize the resolution of the multi-beam at the sample; and/or applying to the control electrodes and the objective electrodes selected potentials to control the control lens array to minimize the resolution of the multi-beam at the sample.

According to some embodiments of the present disclosure, there is provided an assessment system configured to direct charged particles in sub-beams arranged in a multi-beam towards a sample, the system comprising: at least four lens electrodes arranged orthogonal to, and/or in series along, sub-beam paths of the multi-beam and configured to operate on sub-beams along the sub-beam paths; a control lens array comprising at least two of the lens electrodes and including a down beam most electrode down beam of all other lens electrodes of the control lens array; and an objective lens array comprising at least two of the lens electrodes and including the down beam most electrode of the control lens array as the up beam most electrode of the objective lens array, wherein the down beam most electrode of the control lens array comprises an upbeam surface and a down beam surface, the down beam surface comprising part of the objective lens array and the upbeam surface comprising part of the control lens array.

According to some embodiments of the present disclosure, there is provided an assessment system configured to direct charged particles in sub-beams arranged in a multi-beam towards a sample, the system comprising: at least three, preferably at least four, lens electrodes arranged orthogonal to, and/or in series along, sub-beam paths of the multi-beam and configured to operate on sub-beams along the sub-beam paths; at least two of the more up-beam electrodes providing a control lens array which thereby may provide a plurality of control electrodes providing the control lens array and at least two of the more downbeam electrodes providing an objective lens array which thereby may provide a plurality of objective electrodes providing the objective lens array, the most downbeam electrode of the control lens array is the same as the most upbeam electrode of the objective lens array, so that the upbeam surface of the most down beam electrode of the control lens array comprises part of the control lens array and the down-beam surface of said electrode comprises part of the objective lens array.

According to some embodiments of the present disclosure, there is provided an assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; and a plurality of objective electrodes defining an objective lens array configured to direct the sub-beams onto a sample, each objective lens in the objective lens array being aligned with a sub-beam path aligned with a respective control lens, wherein the system is configured to implement a plurality of selectable landing energies for a sub-beam of the multi-beam by applying corresponding potentials to the control electrodes and the objective electrodes; and the system is configured to select the corresponding potentials such that a spatial relationship between an image plane of the system and all of the control electrodes and objective electrodes is the same for each of the selectable landing energies.

There are provided a number of clauses:

Clause 1: An assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller configured to implement a plurality of selectable landing energies for a sub-beam of the multi-beam by applying corresponding potentials to the control electrodes and the objective electrodes, wherein: the controller is configured to select the corresponding potentials such that a spatial relationship between an image plane of the system and all of the control electrodes and objective electrodes is the same for each of the selectable landing energies. Desirably the controller is configured to apply potentials to the control electrodes and the objective electrodes. Desirably the applied potentials are selected to maintain the same spatial relationship between an image plane and optionally all of the control electrodes and objective electrodes. Desirably, the plurality of selectable landing energies are implemented by the controller by applying corresponding potentials to the control electrodes and the objective electrodes (e.g. via respective potential sources). Different potentials may be applied for each selectable landing energy.

Clause 2: The system of clause 1, configured to receive user input and wherein the controller is configured to select the selectable landing energies based at least partially on the received user input.

Clause 3: The system of clause 1 or 2, wherein the controller is configured to select the selectable landing energies based at least partially on a predefined program or one or more input parameters.

Clause 4: The system of any preceding clause, wherein the plurality of selectable landing energies comprises at least one continuous range of landing energies or a plurality of predetermined discrete landing energies.

Clause 5: The system of any preceding clause, wherein the controller is configured to apply the same potential to the control electrode configured to be furthest from the sample and which is part of at least the control lens aligned with the sub-beam path of the sub-beam, for at least a portion of the selectable landing energies.

Clause 6: The system of any preceding clause, wherein the controller is configured to apply a different potential to the objective electrode configured to be furthest from the sample and which is part of at least the objective lens aligned with the sub-beam path of the sub-beam, for each of at least a portion of the selectable landing energies, each potential being selected to provide the same distance between said objective electrode and an image plane of the system.

Clause 7: The system of any preceding clause, wherein the controller is configured to select each selectable landing beam energy by controlling at least a potential applied to the objective electrode configured to be closest to the sample and which is part of at least the objective lens aligned with the sub-beam path of the sub-beam.

Clause 8: The system of any preceding clause, wherein the controller is configured to control the control lens array to: minimize resolution of the sub-beam, for example on the sample, for each of the plurality of selectable landing energies; or minimize the resolved or resolvable dimension of the sub-beam on the sample for each of the plurality of selectable landing energies.

Clause 9: The system of any of clauses 1-7, wherein the controller is configured to provide a plurality of selectable beam currents of the sub-beam for one of the selectable landing beam energies or for each of a plurality of the selectable landing beam energies.

Clause 10: The system of clause 9, wherein the controller is configured to implement each selectable beam current by selecting a corresponding demagnification of the control lens array.

Clause 11: The system of clause 9, wherein, for each selectable beam current, the controller is configured to control the control lens aligned with the sub-beam path of the sub-beam to select a corresponding demagnification of the system.

Clause 12: An assessment system configured to direct charged particles in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller, wherein the controller is configured to provide a plurality of selectable beam currents of a sub-beam, and to implement each selectable beam current by selecting a corresponding demagnification of the control lens array; and/or the controller is configured to: —implement a plurality of selectable landing energies for a sub-beam of the multi-beam by applying corresponding potentials to the control electrodes and the objective electrodes; and—on implementation of the selected landing energies apply potentials to the control electrodes to select corresponding minimized resolutions of the sub-beam on the sample.

Clause 13: The system of any of clauses 9-12, wherein: the control lens array comprises three control electrodes aligned with the sub-beam path of the sub-beam; and the controller is configured to implement each selectable beam current by applying a corresponding potential to the middle electrode of the three control electrodes.

Clause 14: The system of any preceding clause, wherein the objective electrode configured to be furthest from the sample and part of at least the objective lens aligned with the sub-beam path of the sub-beam and the control electrode configured to be closest to the sample and part of at least the control lens aligned with the sub-beam path of the sub-beam are provided by a common electrode.

Clause 15: The system of any preceding clause, wherein the controller is configured to apply a blocking mode by application of a blocking potential within one or more of the control lenses, the blocking potential being such as to cause charged particles entering the one or more control lenses towards the sample in use to be electrostatically reflected away from the sample.

Clause 16: An assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller configured to apply a blocking mode by application of a blocking potential within one or more of the control lenses, the blocking potential being such as to cause charged particles entering the one or more control lenses towards the sample in use to be electrostatically reflected away from the sample.

Clause 17: The system of clause 15 or 16, wherein: the control lens array comprises three control electrodes aligned with the sub-beam path of each sub-beam; and the system is configured to apply the blocking mode by application of the blocking potential to at least the middle control electrode of the three control electrodes.

Clause 18: The system of clause 15 or 16, wherein: the control lens array comprises two control electrodes aligned with the sub-beam path of each sub-beam; and the system is configured to apply the blocking mode by application of the blocking potential to the control electrode configured to be closest to the sample.

Clause 19: The system of any preceding clause, wherein the control electrodes are arranged in series along the sub-beam paths and define respective apertures aligned with the sub-beam paths to define the control lenses.

Clause 20: The system of clause 19, wherein each control electrode is configured to operate on all of the sub-beams of the multi-beam.

Clause 21: An assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller, wherein: the controller configured to maintain a fixed spatial relationship between an image plane of the system and all of the control electrodes and objective electrodes; and i) the control lens array is configured to be controllable to minimize the resolution of the multi-beam at the sample; ii) the controller is configured to control the control lens array so as to minimize the resolution of the multi-beam at the sample; and/or iii) the controller is configured to apply to the control electrodes and the objective electrodes selected potentials to control the control lens array so as to minimize the resolution of the multi-beam at the sample.

Clause 22: The system of clause 21, wherein: the controller is configured to implement a plurality of selectable landing energies for a sub-beam of the multi-beam by applying corresponding potentials to the control electrodes and the objective electrodes; and the controller is configured such that the minimization of the resolution is performed for each of the selectable landing energies by controlling demagnification of the control lens array.

Clause 23: A method of assessing a sample by directing charged particles in sub-beams arranged in a multi-beam towards the sample using a system comprising: a plurality of control electrodes defining a control lens array, each control lens in the control lens array configured to operate on a respective sub-beam; and a plurality of objective electrodes defining an objective lens array configured to direct the sub-beams onto a sample, and each objective lens configured to operate on a sub-beam from a respective control lens of the control lens array, the method comprising: selecting for a sub-beam of the multi-beam a plurality of different landing energies at different times, each landing energy being selected by applying corresponding potentials to the control electrodes and the objective electrodes, wherein the corresponding potentials are selected such that a spatial relationship between an image plane of the system and all of the control electrodes and objective electrodes is the same for each of the different landing energies.

Clause 24: A method of using an assessment system that directs charged particles in sub-beams arranged in a multi-beam towards a sample, the system comprising control electrodes for operating on a multi-beam of sub-beams and objective electrodes for focusing the sub-beams onto an image plane, the image plane of the system and all of the control electrodes and objective electrodes having a fixed spatial relationship, the method comprising: implementing a plurality of selectable landing energies for a sub-beam of the multi-beam, the implementing comprising applying corresponding potentials to the control electrodes and the objective electrodes; and selecting the corresponding potentials given the fixed spatial relationship.

Clause 25: A method of assessing a sample by directing charged particles in sub-beams arranged in a multi-beam towards the sample using a system comprising: a plurality of control electrodes defining a control lens array, each control lens in the control lens array configured to operate on a respective sub-beam; and a plurality of objective electrodes defining an objective lens array configured to direct the sub-beams onto a sample, and each objective lens configured to operate on a sub-beam from a respective control lens of the control lens array, the method comprising: selecting for a sub-beam of the multi-beam a plurality of different beam currents at different times, each beam current being implemented by selecting a corresponding demagnification of the control lens array; and/or implementing a plurality of selectable landing energies for a sub-beam of the multi-beam by applying corresponding potentials to the control electrodes and the objective electrodes, potentials to the control electrodes being selected to minimize resolution of the sub-beam on the sample.

Clause 26: A method of assessing a sample by directing charged particles in sub-beams arranged in a multi-beam towards the sample using a system comprising: a plurality of control electrodes defining a control lens array, each control lens in the control lens array configured to operate on a respective sub-beam; and a plurality of objective electrodes defining an objective lens array configured to direct the sub-beams onto a sample, and each objective lens configured to operate on a sub-beam from a respective control lens of the control lens array, the method comprising: applying a blocking mode by application of a blocking potential within one or more of the control lenses, the blocking potential being such as to cause charged particles entering the one or more control lenses towards the sample to be electrostatically reflected away from the sample.

Clause 27: A method of assessing a sample by directing charged particles in sub-beams arranged in a multi-beam towards the sample using a system comprising: a plurality of control electrodes defining a control lens array, each control lens in the control lens array configured to operate on a respective sub-beam; and a plurality of objective electrodes defining an objective lens array configured to direct the sub-beams onto a sample, and each objective lens configured to operate on a sub-beam from a respective control lens of the control lens array, the method comprising: while maintain a fixed spatial relationship between an image plane of the system and all of the control electrodes and objective electrodes: controlling the control lens array to minimize the resolution of the multi-beam at the sample; and/or applying to the control electrodes and the objective electrodes selected potentials to control the control lens array to minimize the resolution of the multi-beam at the sample.

Clause 28: The method of any of clauses 23-27, further comprising detecting signal electrons emitted from the sample.

Clause 29: An assessment system configured to direct charged particles in sub-beams arranged in a multi-beam towards a sample, the system comprising: at least four lens electrodes arranged orthogonal to, and/or in series along, sub-beam paths of the multi-beam and configured to operate on sub-beams along the sub-beam paths; a control lens array comprising at least two of the lens electrodes and including a down beam most electrode down beam of all other lens electrodes of the control lens array; and an objective lens array comprising at least two of the lens electrodes and including the down beam most electrode of the control lens array as the up beam most electrode of the objective lens array, wherein the down beam most electrode of the control lens array comprises an upbeam surface and a down beam surface, the down beam surface comprising part of the objective lens array and the upbeam surface comprising part of the control lens array.

Clause 30: An assessment system configured to direct charged particles in sub-beams arranged in a multi-beam towards a sample, the system comprising: at least three, preferably at least four, lens electrodes arranged orthogonal to, and/or in series along, sub-beam paths of the multi-beam and configured to operate on sub-beams along the sub-beam paths; at least two of the more up-beam electrodes providing a control lens array which thereby may provide a plurality of control electrodes providing the control lens array and at least two of the more downbeam electrodes providing an objective lens array which thereby may provide a plurality of objective electrodes providing the objective lens array, the most downbeam electrode of the control lens array is the same as the most upbeam electrode of the objective lens array, so that the upbeam surface of the most down beam electrode of the control lens array comprises part of the control lens array and the down-beam surface of said electrode comprises part of the objective lens array.

Clause 31: The system of clause 29 or 30, further comprising a controller configured to apply to the control electrodes and the objective electrodes selected potentials so as to control the control lens array and the objective lens array.

Clause 32: The system of clause 31, wherein the controller is configured to cause the system to perform the method of any of clauses 23-28.

Clause 33: An assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; and a plurality of objective electrodes defining an objective lens array configured to direct the sub-beams onto a sample, each objective lens in the objective lens array being aligned with a sub-beam path aligned with a respective control lens, wherein the system is configured to implement a plurality of selectable landing energies for a sub-beam of the multi-beam by applying corresponding potentials to the control electrodes and the objective electrodes; and the system is configured to select the corresponding potentials such that a spatial relationship between an image plane of the system and all of the control electrodes and objective electrodes is the same for each of the selectable landing energies.

Clause 34: An assessment system configured to direct charged particles in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; and a plurality of objective electrodes defining an objective lens array configured to direct the sub-beams onto a sample, each objective lens in the objective lens array being aligned with a sub-beam path aligned with a respective control lens, wherein: the system is configured to provide a plurality of selectable beam currents of a sub-beam, and to implement each selectable beam current by selecting a corresponding demagnification of the control lens array; and/or the system is configured to: —implement a plurality of selectable landing energies for a sub-beam of the multi-beam by applying corresponding potentials to the control electrodes and the objective electrodes; and—on implementation of the selected landing energies apply potentials to the control electrodes to selecting corresponding minimized resolutions of the sub-beam on the sample.

Clause 35: An assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; and a plurality of objective electrodes defining an objective lens array configured to direct the sub-beams onto a sample, each objective lens in the objective lens array being aligned with a sub-beam path aligned with a respective control lens, wherein: the system is configured to apply a blocking mode by application of a blocking potential within one or more of the control lenses, the blocking potential being such as to cause charged particles entering the one or more control lenses towards the sample in use to be electrostatically reflected away from the sample.

Clause 36: An assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; and a plurality of objective electrodes defining an objective lens array configured to direct the sub-beams onto a sample, each objective lens in the objective lens array being aligned with a sub-beam path aligned with a respective control lens, wherein: the system is configured to maintain a fixed spatial relationship between an image plane of the system and all of the control electrodes and objective electrodes; and i) the control lens array is configured to be controllable to minimize the resolution of the multi-beam at the sample; ii) the system is configured to control the control lens array so as to minimize the resolution of the multi-beam at the sample; and/or iii) the system is configured to apply to the control electrodes and the objective electrodes selected potentials to control the control lens array so as to minimize the resolution of the multi-beam at the sample.

Clause 37: An assessment system configured to direct charged particles in sub-beams arranged in a multi-beam towards a sample, the system comprising: a plurality of control electrodes defining a control lens array, each control lens in the control lens array being aligned with a sub-beam path of a respective sub-beam of the multi-beam and configured to operate on the respective sub-beam; a plurality of objective electrodes defining an objective lens array configured to direct the sub-beams onto a sample, each objective lens in the objective lens array being aligned with a sub-beam path aligned with a respective control lens; and a controller being configured to control the beam energy of each sub-beam by applying selected potentials to the objective electrodes and control electrodes i) to control the control electrodes and/or objective electrodes so that control of demagnification varies resolution versus total current of each sub-beam; ii) to control the demagnification of the control electrodes and/or objective electrodes so as to minimize the resolution of each sub-beam of the multi-beam at the sample, preferably whilst varying the landing energy; and/or iii) to apply to the control electrodes and/or the objective electrodes selected potentials to maintain the focus of each sub-beam in the image plane of the system preferably whilst varying the landing energy, the image plane of the system and all of the control electrodes and objective electrodes having a fixed spatial relationship Clause 38: The system of clause 37, wherein the image plane of the system and all of the control electrodes and objective electrodes having a fixed spatial relationship.

Clause 39: The system of clause 37 or 38, wherein the controller is confirmed to maintain the fixed spatial relationship.

While the present invention has been described in connection with various embodiments, other embodiments of the invention will be apparent to those skilled in the art from consideration of the specification and practice of the technology disclosed herein. It is intended that the specification and examples be considered as exemplary only, with a true scope and spirit of the invention being indicated by the following claims.

The invention claimed is:

1. An assessment system configured to direct charged particles in sub-beams arranged in a multi-beam towards a sample, the system comprising:

a plurality of control electrodes defining a control lens array, each control lens in the control lens array being aligned with a sub-beam path of a respective sub-beam of the multi-beam and configured to operate on the respective sub-beam;

a plurality of objective electrodes defining an objective lens array configured to direct the sub-beams onto a sample, each objective lens in the objective lens array being aligned with a sub-beam path aligned with a respective control lens; and a controller configured to implement a plurality of selectable landing energies for a sub-beam of the multi-beam by applying corresponding potentials to the control electrodes and the objective electrodes, wherein:

the controller is configured to select the corresponding potentials such that a spatial relationship between an image plane of the system and all of the control electrodes and objective electrodes is the same for each of the selectable landing energies.

2. The system of claim 1, configured to receive user input and wherein the controller is configured to select the selectable landing energies based at least partially on the received user input.

3. The system of claim 1, wherein the controller is configured to select the selectable landing energies based at least partially on a predefined program or one or more input parameters.

4. The system of claim 1, wherein the plurality of selectable landing energies comprises at least one continuous range of landing energies or a plurality of predetermined discrete landing energies.

5. The system of claim 1, wherein the controller is configured to apply the same potential to the control electrode configured to be furthest from the sample and which is part of at least the control lens aligned with the sub-beam path of the sub-beam, for at least a portion of the selectable landing energies.

6. The system of claim 1, wherein the controller is configured to apply a different potential to the objective electrode configured to be furthest from the sample and which is part of at least the objective lens aligned with the sub-beam path of the sub-beam, for each of at least a portion of the selectable landing energies, each potential being selected to provide the same distance between said objective electrode and an image plane of the system.

7. The system of claim 1, wherein the controller is configured to select each selectable landing beam energy by controlling at least a potential applied to the objective electrode configured to be closest to the sample and which is part of at least the objective lens aligned with the sub-beam path of the sub-beam.

8. The system of claim 1, wherein the controller is configured to control the control lens array to minimize resolution of the sub-beam on the sample for each of the plurality of selectable landing energies.

9. The system of claim 1, wherein the controller is configured to provide a plurality of selectable beam currents of the sub-beam for one of the selectable landing beam energies or for each of a plurality of the selectable landing beam energies.

10. The system of claim 9, wherein the controller is configured to implement each selectable beam current by selecting a corresponding demagnification of the control lens array.

11. The system of claim 9, wherein, for each selectable beam current, the controller is configured to control the control lens aligned with the sub-beam path of the sub-beam to select a corresponding demagnification of the system.

12. The system of claim 9, wherein:

the control lens array comprises three control electrodes aligned with the sub-beam path of the sub-beam; and the controller is configured to implement each selectable beam current by applying a corresponding potential to the middle electrode of the three control electrodes.

13. The system of claim 1, wherein the objective electrode configured to be furthest from the sample and part of at least the objective lens aligned with the sub-beam path of the sub-beam and the control electrode configured to be closest to the sample and part of at least the control lens aligned with the sub-beam path of the sub-beam are provided by a common electrode.

14. The system of claim 1, wherein the controller is configured to apply a blocking mode by application of a blocking potential within one or more of the control lenses, the blocking potential being such as to cause charged particles entering the one or more control lenses towards the sample in use to be electrostatically reflected away from the sample.

15. A method of using an assessment system that directs charged particles in sub-beams arranged in a multi-beam towards a sample, the system comprising control electrodes for operating on a multi-beam of sub-beams and objective electrodes for focusing the sub-beams onto an image plane, the image plane of the system and all of the control electrodes and objective electrodes having a fixed spatial relationship, the method comprising:

implementing a plurality of selectable landing energies for a sub-beam of the multi-beam, the implementing comprising applying corresponding potentials to the control electrodes and the objective electrodes; and selecting the corresponding potentials given the fixed spatial relationship.

16. The method of claim 15, further comprising detecting signal electrons emitted from the sample.

17. An assessment system configured to direct charged particles in a multi-beam towards a sample, the system comprising:

a plurality of control electrodes defining a control lens array, each control lens in the control lens array being aligned with a sub-beam path of a respective sub-beam of the multi-beam and configured to operate on the respective sub-beam;

a plurality of objective electrodes defining an objective lens array configured to direct the sub-beams onto a sample, each objective lens in the objective lens array being aligned with a sub-beam path aligned with a respective control lens; and a controller, wherein the controller is configured to provide a plurality of selectable beam currents of a sub-beam, and to implement each selectable beam current by selecting a corresponding demagnification of the control lens array; and the controller is configured to:

implement a plurality of selectable landing energies for a sub-beam of the multi-beam by applying corresponding potentials to the control electrodes and the objective electrodes; and on implementation of the selected landing energies, apply potentials to the control electrodes to select corresponding minimized resolutions of the sub-beam on the sample.

18. The system of claim 17, wherein:

the control lens array comprises three control electrodes aligned with the sub-beam path of the sub-beam; and the controller is configured to implement each selectable beam current by applying a corresponding potential to the middle electrode of the three control electrodes.

19. The system of claim 17, wherein the objective electrode configured to be furthest from the sample and part of at least the objective lens aligned with the sub-beam path of the sub-beam and the control electrode configured to be closest to the sample and part of at least the control lens aligned with the sub-beam path of the sub-beam are provided by a common electrode.

20. The system of claim 17, wherein the controller is configured to apply a blocking mode by application of a blocking potential within one or more of the control lenses, the blocking potential being such as to cause charged particles entering the one or more control lenses towards the sample in use to be electrostatically reflected away from the sample.

* * * * *